(12) United States Patent
Ikeda et al.

(10) Patent No.: US 12,148,842 B2
(45) Date of Patent: Nov. 19, 2024

(54) SEMICONDUCTOR SUBSTRATE AND DISPLAY DEVICE

(71) Applicant: Japan Display Inc., Tokyo (JP)

(72) Inventors: Masataka Ikeda, Tokyo (JP); Hirotaka Hayashi, Tokyo (JP); Hitoshi Tanaka, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/181,572

(22) Filed: Mar. 10, 2023

(65) Prior Publication Data

US 2023/0215957 A1 Jul. 6, 2023

Related U.S. Application Data

(63) Continuation of application No. 16/779,680, filed on Feb. 3, 2020, now Pat. No. 11,626,520.

(30) Foreign Application Priority Data

Feb. 6, 2019 (JP) ................................. 2019-019792
Jun. 27, 2019 (JP) ................................. 2019-119960

(51) Int. Cl.
*H01L 29/786* (2006.01)
*G02F 1/167* (2019.01)
(Continued)

(52) U.S. Cl.
CPC ........ *H01L 29/78696* (2013.01); *G02F 1/167* (2013.01); *G02F 1/16766* (2019.01);
(Continued)

(58) Field of Classification Search
CPC ............. H01L 29/78696; H01L 27/124; H01L 27/1222; H01L 27/1225
See application file for complete search history.

(56) References Cited

U.S. PATENT DOCUMENTS

2009/0244689 A1 10/2009 Lin
2013/0043479 A1* 2/2013 Kim ................. H01L 29/78696
257/60

FOREIGN PATENT DOCUMENTS

JP H1-274117 A 11/1989
JP H6-67199 A 3/1994
JP 2007-266252 A 10/2007

OTHER PUBLICATIONS

Japanese Office Action issued Jan. 10, 2023 in corresponding Japanese Patent Application No. 2019-119960 (machine-generated English translation only), 6 pages.
(Continued)

*Primary Examiner* — Peter M Albrecht
(74) *Attorney, Agent, or Firm* — XSENSUS LLP

(57) ABSTRACT

According to one embodiment, a semiconductor substrate includes a first basement, a gate line, a source line, an insulating film, a first pixel electrode, and a first transistor and a second transistor connected parallel at positions between the source line and the first pixel electrode. Each of a first semiconductor layer of the first transistor and a second semiconductor layer of the second transistor includes a first region, a second region, and a channel region. The first semiconductor layer and the second semiconductor layer are in contact with a first surface that is a surface of the insulating film on the source line side. The channel region of each of the first semiconductor layer and the second semiconductor layer wholly overlaps the gate line.

15 Claims, 24 Drawing Sheets

(51) Int. Cl.
*G02F 1/16766* (2019.01)
*H01L 27/12* (2006.01)
*H01L 49/02* (2006.01)

(52) U.S. Cl.
CPC ........ *H01L 27/1225* (2013.01); *H01L 27/124* (2013.01); *H01L 27/1255* (2013.01); *H01L 28/60* (2013.01); *H01L 29/78648* (2013.01); *H01L 29/7869* (2013.01)

(56) References Cited

OTHER PUBLICATIONS

Office Action issued Mar. 3, 2023 in Chinese Patent Application No. 202010080626.3, 6 pages.

\* cited by examiner

|  | | Channel length (L) [μm] | | | |
|---|---|---|---|---|---|
|  | | 3.5 | 5.0 | 6.0 | 8.0 |
| Channel width (W) [μm] | 3.0 | B (0.86) | A (0.6) | A (0.5) | A (0.38) |
| | 4.0 | B (1.1) | A (0.8) | A (0.67) | A (0.5) |
| | 4.5 | B (1.3) | B (0.9) | A (0.75) | A (0.56) |
| | 6.0 | B (1.7) | B (1.2) | B (1.0) | A (0.75) |
| | 10.0 | B (2.9) | B (2.0) | B (1.7) | B (1.3) |

FIG. 9

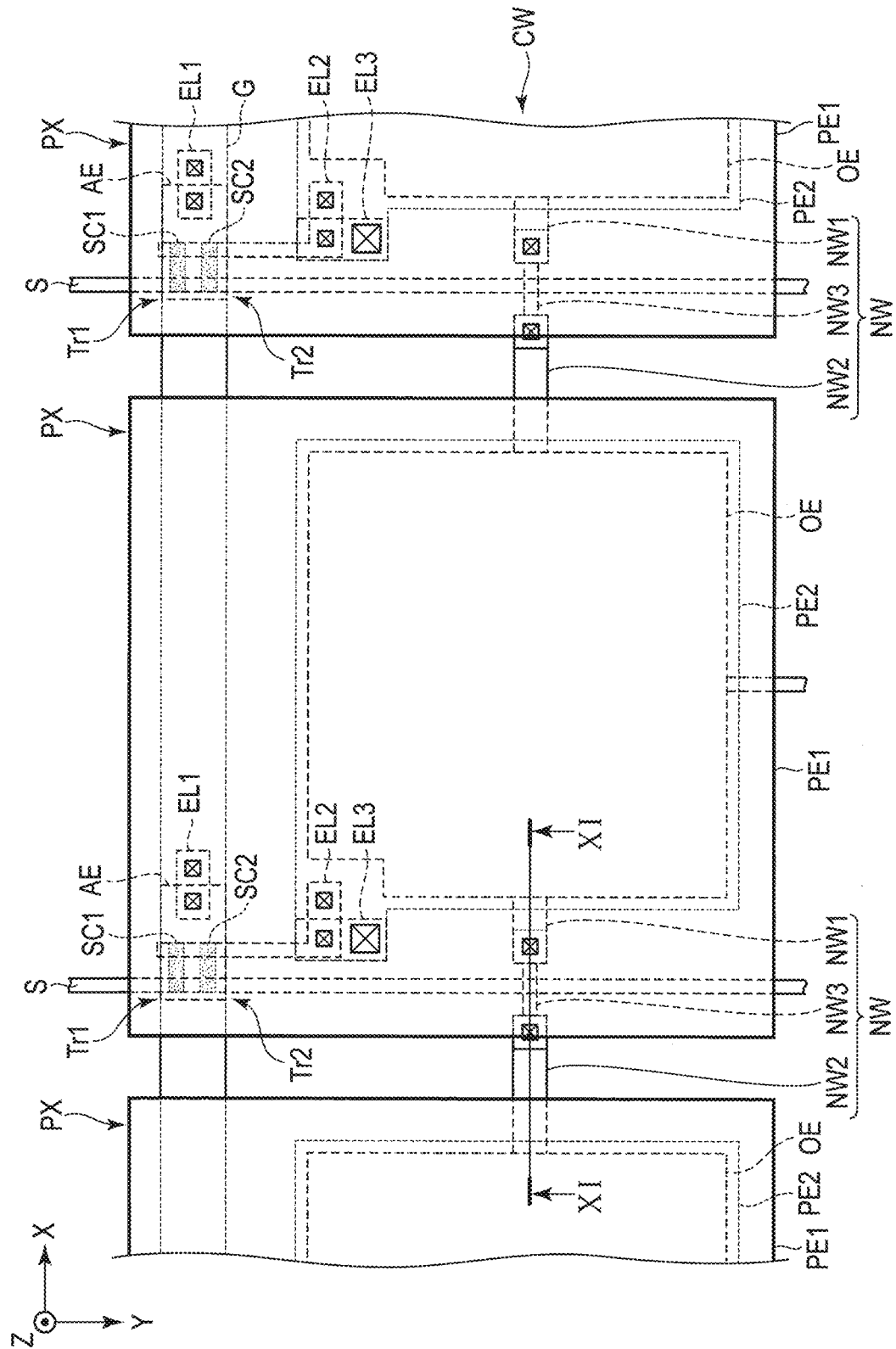
F I G. 10

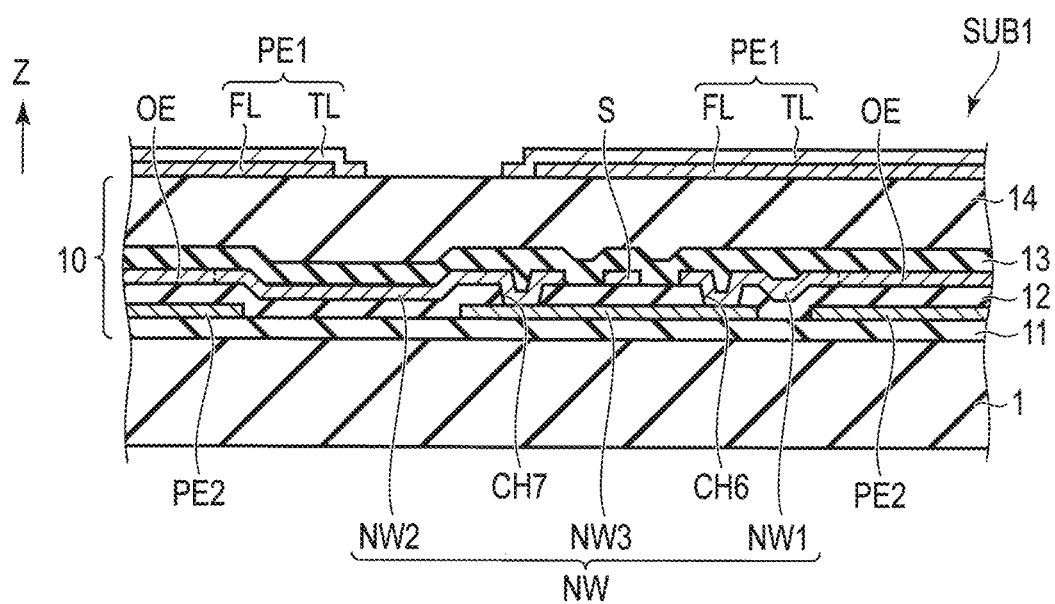
F I G. 11

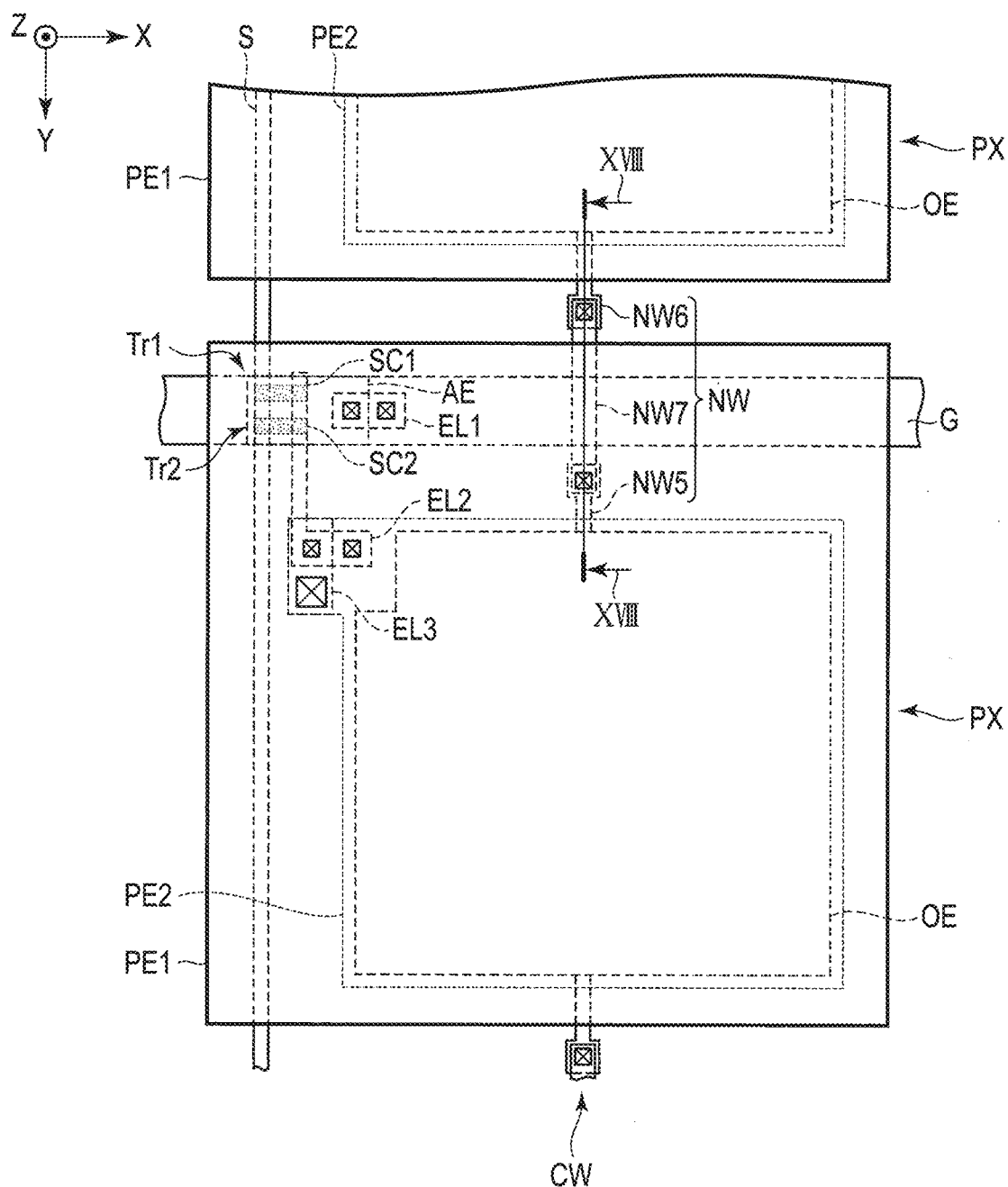
F I G. 17

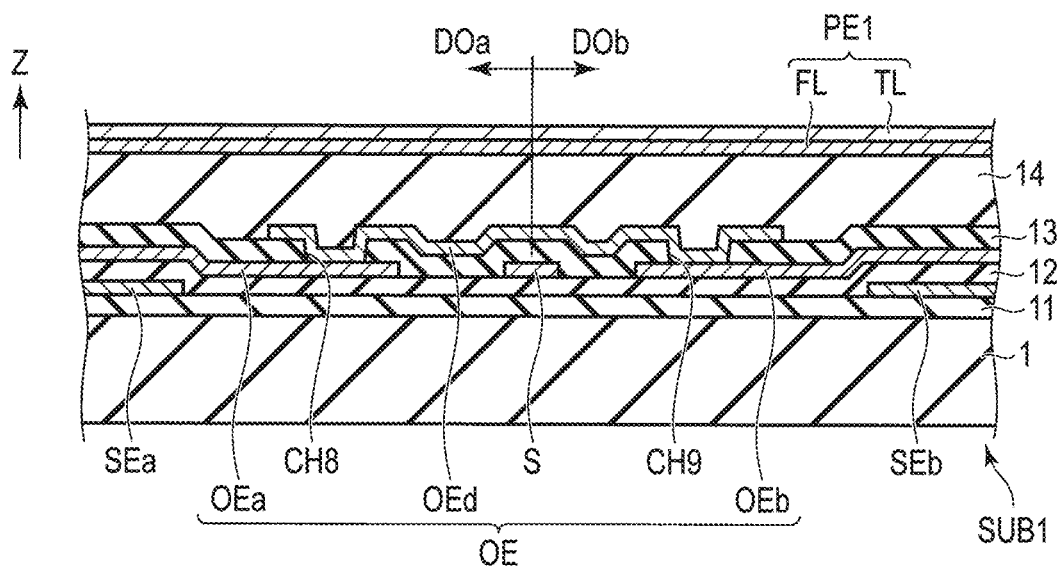
F I G. 20
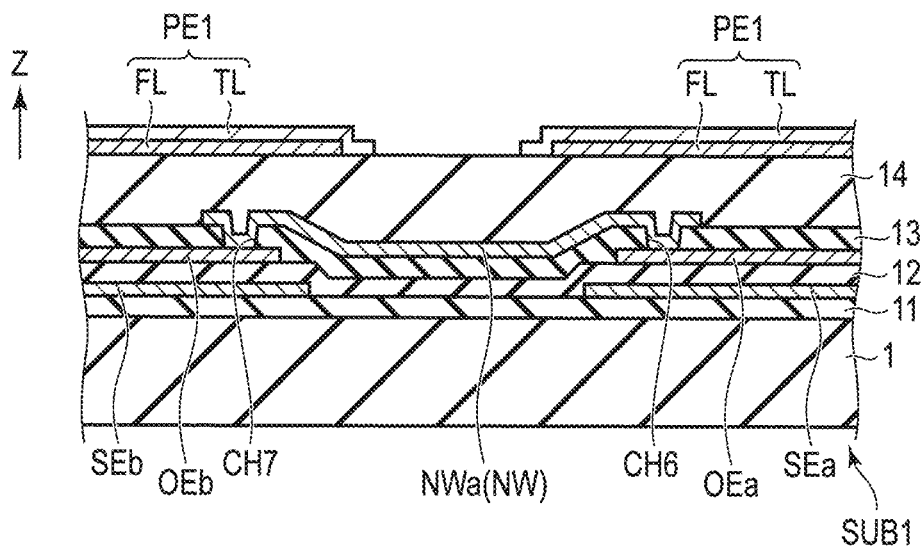
F I G. 21

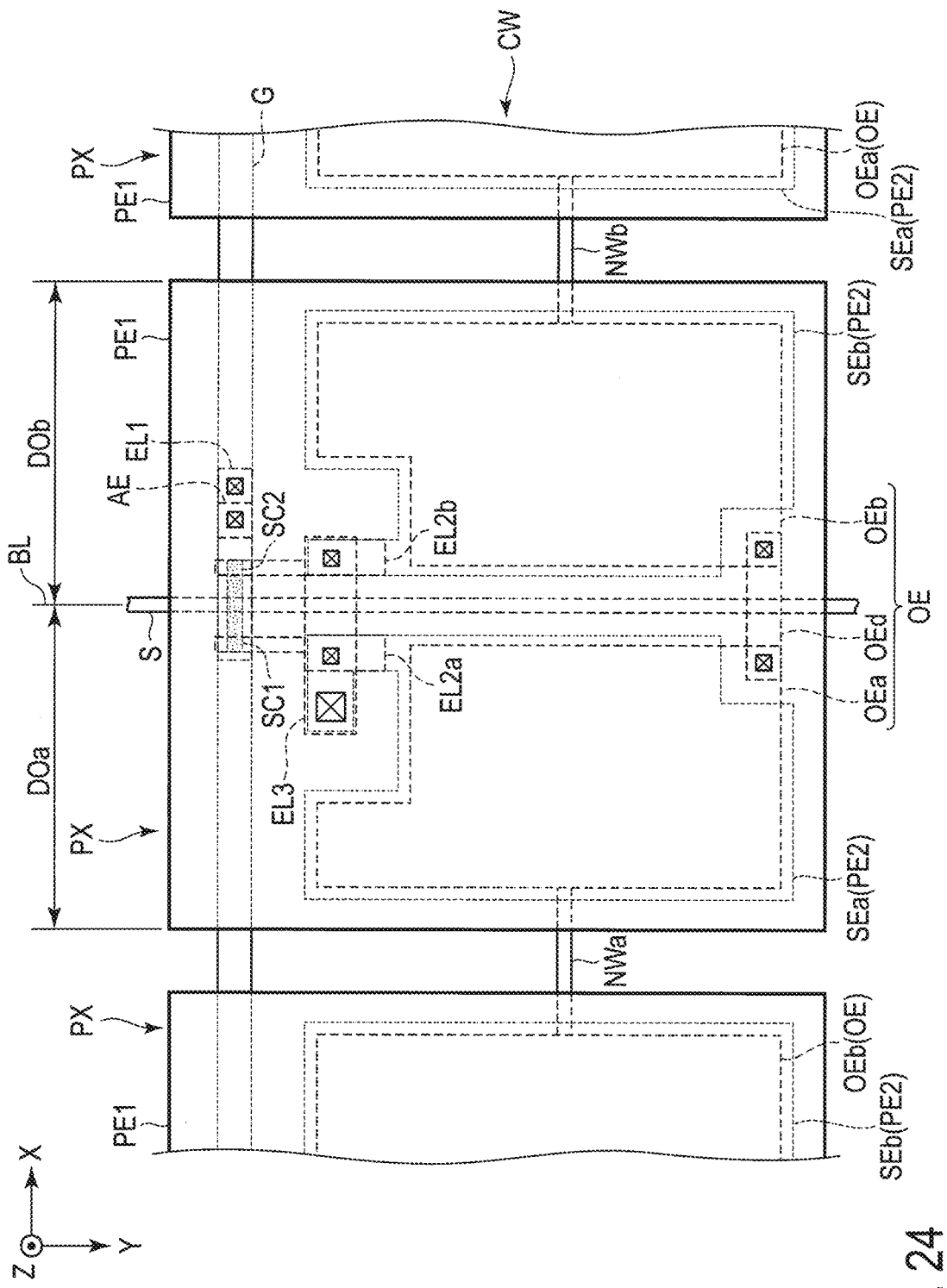
F I G. 24

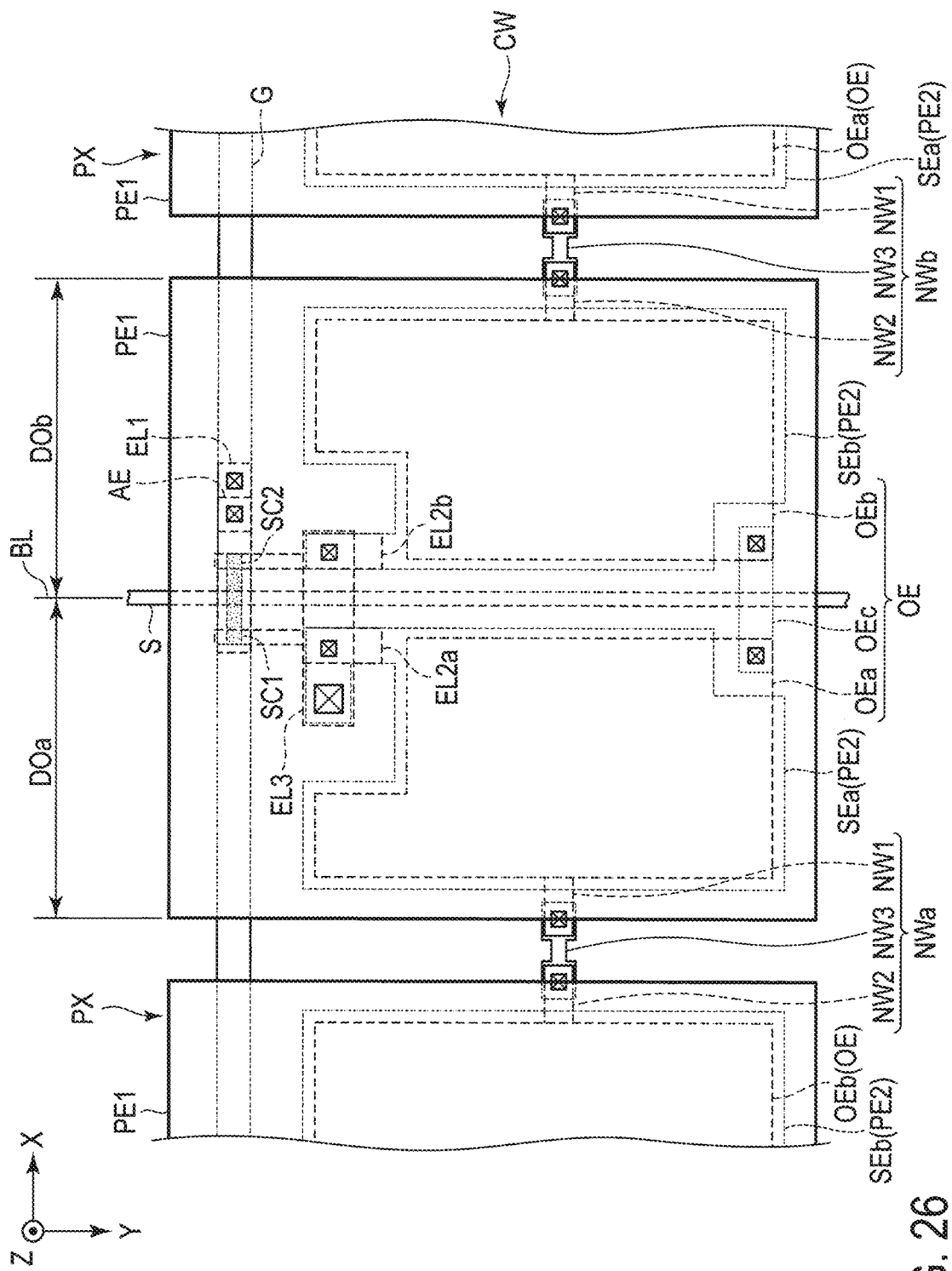
F I G. 26

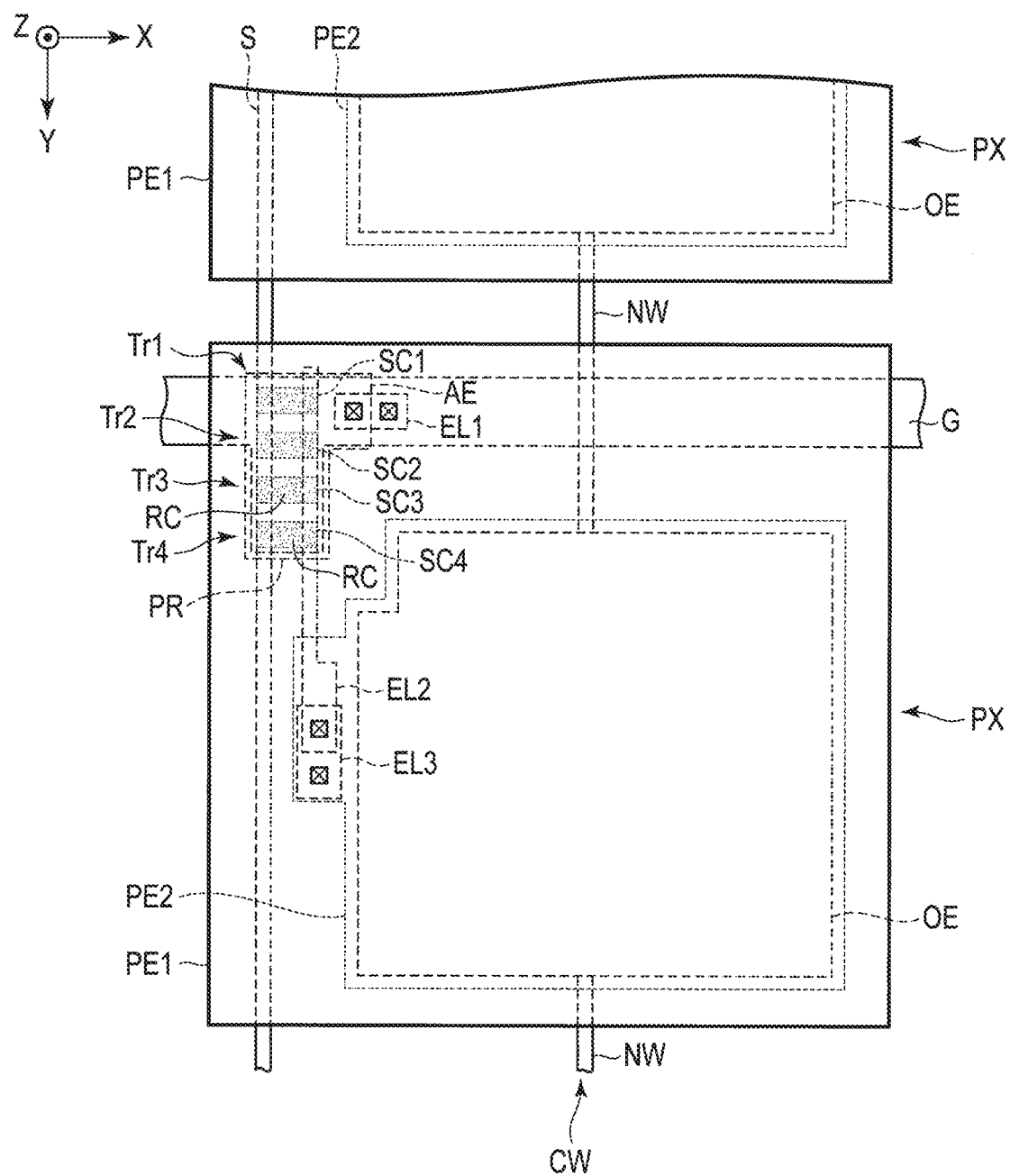
F I G. 28

SEMICONDUCTOR SUBSTRATE AND DISPLAY DEVICE

CROSS-REFERENCE TO RELATED APPLICATIONS

This application is a continuation of U.S. application Ser. No. 16/779,680, filed Feb. 3, 2020, which is based upon and claims the benefit of priority from Japanese Patent Applications No. 2019-019792, filed Feb. 6, 2019; and No. 2019-119960, filed Jun. 27, 2019, the entire contents of all of which are incorporated herein by reference.

FIELD

Embodiments described herein relate generally to a semiconductor substrate and a display device.

BACKGROUND

As a display device, for example, an electrophoretic display device is known. In the electrophoretic display device, a thin-film transistor is used as a switching element. An amount of a current flowing to the thin-film transistor can be increased by making a channel width of the thin-film transistor larger.

BRIEF DESCRIPTION OF THE DRAWINGS

FIG. 9 is a table showing a determination result of varying a channel width and a channel length of each semiconductor layer in FIG. 6, and a W/L value.

FIG. 10 is an enlarged plan view showing parts of a first substrate of a display device according to a second embodiment.

FIG. 11 is a cross-sectional view showing the first substrate viewed along line XI-XI in FIG. 10.

FIG. 17 is an enlarged plan view showing parts of a first substrate of a display device according to a fourth embodiment.

FIG. 20 is a cross-sectional view showing the first substrate viewed along line XX-XX in FIG. 19.

FIG. 21 is a cross-sectional view showing the first substrate viewed along line XXI-XXI in FIG. 19.

FIG. 24 is an enlarged plan view showing parts of a first substrate of a display device according to a seventh embodiment.

FIG. 26 is an enlarged plan view showing parts of a first substrate of a display device according to a ninth embodiment.

FIG. 28 is an enlarged plan view showing parts of a first substrate of a display device according to an eleventh embodiment.

DETAILED DESCRIPTION

Figure 1:
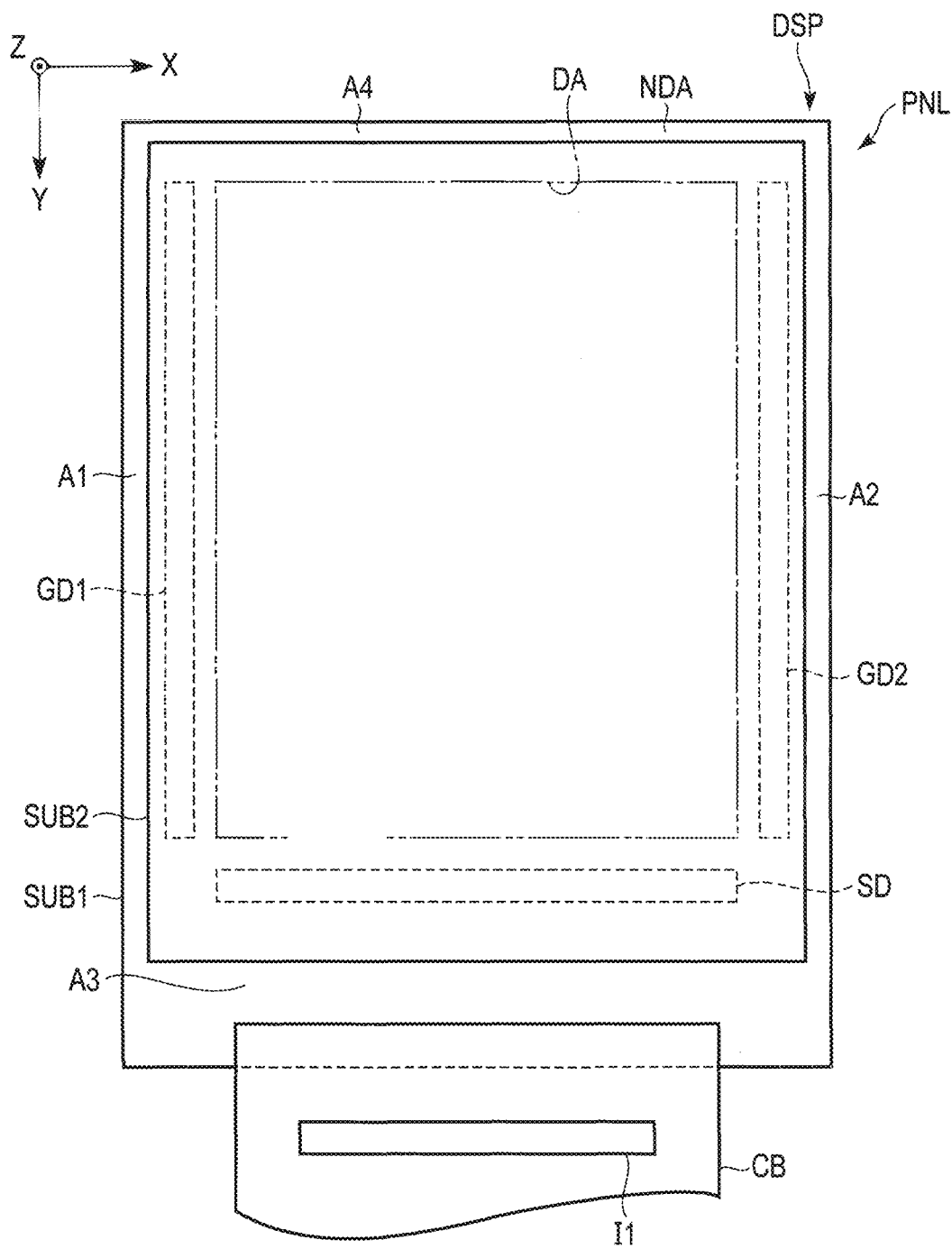
FIG. 1 is a plan view showing a configuration of a display device according to a first embodiment.

In general, according to one embodiment, there is provided a semiconductor substrate comprising a first basement, a gate line located above the first basement, a source line located above the first basement, an insulating film located above the gate line and below the source line, a first pixel electrode located above the first basement, the gate line, and the source line, and a first transistor and a second transistor located above the first basement and electrically connected parallel at positions between the source line and the first pixel electrode. Each of a first semiconductor layer of the first transistor and a second semiconductor layer of the second transistor includes a first region electrically connected to the source line, a second region electrically connected to the first pixel electrode, and a channel region between the first region and the second region. The first semiconductor layer and the second semiconductor layer are in contact with a first surface that is a surface of the insulating film on the source line side. The channel region of each of the first semiconductor layer and the second semiconductor layer wholly overlaps the gate line.

According to another embodiment, there is provided a display device comprising: a semiconductor substrate comprising a first basement, a gate line located above the first basement, a source line located above the first basement, an insulating film located above the gate line and below the source line, a first pixel electrode located above the first basement, the gate line, and the source line, and a first transistor and a second transistor located above the first basement and electrically connected parallel at positions between the source line and the first pixel electrode; a counter-substrate including a second basement opposed to the first pixel electrode, and a counter-electrode located between the second basement and the first pixel electrode and opposed to the first pixel electrode; and a display function layer located between the first pixel electrode and the counter-electrode with a voltage to be applied between the first pixel electrode and the counter-electrode applied to the display function layer. Each of a first semiconductor layer of the first transistor and a second semiconductor layer of the second transistor includes a first region electrically connected to the source line, a second region electrically connected to the first pixel electrode, and a channel region between the first region and the second region. The first semiconductor layer and the second semiconductor layer are in contact with a first surface that is a surface of the insulating film on the source line side. The channel region of each of the first semiconductor layer and the second semiconductor layer wholly overlaps the gate line.

Various embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

First, a display device DSP according to a first embodiment will be described in detail. FIG. 1 is a plan view showing a configuration of the display device DSP according to the first embodiment.

As shown in FIG. 1, in the present embodiment, the first direction X and the second direction Y are orthogonal to each other. The directions described herein are directions indicated by arrows in the drawings, and directions reversed at 180° with respect to the arrows are referred to as opposite directions. The first direction X and the second direction Y may intersect each other at an angle other than 90°. A third direction Z is perpendicular to each of the first direction X and the second direction Y. The third direction Z corresponds to a thickness direction of the display device DSP.

The display device DSP comprises an active-matrix display panel PNL, a circuit board (wiring substrate) CB, an IC chips I1, and the like. The display panel PNL comprises a first substrate SUB1, and a second substrate SUB2 opposed to the first substrate SUB1. In the present embodiment, the first substrate SUB1 is formed in a rectangular shape, and the second substrate SUB2 is formed in a rectangular shape having an outline smaller than the first substrate SUB1.

In the following explanations, a direction from the first substrate SUB1 to the second substrate SUB2 is referred to as an upward direction (or, more simply, upwardly) and a direction from the second substrate SUB2 to the first substrate SUB1 is referred to as a downward direction (or, more simply, downwardly). Expressions as "a second component above a first component" and "a second component below a first component" mean that the second component may be in contact with the first component or may be located apart from the first component. In the latter case, a third component may be interposed between the first component and the second component. In addition, an observation position at which the display device DSP is observed is assumed to be located on the tip side of the arrow indicating the third direction Z, and viewing from the observation position toward the X-Y plane defined by the first direction X and the second direction Y is called a planar view.

The display panel PNL comprises a display area DA on which an image is displayed and a non-display area NDA other than the display area DA. In the present embodiment, the non-display area NDA is formed in a frame shape.

In the non-display area NDA, a strip-shaped area which is located on the left side of the display area DA and which extends in the second direction Y is called a first area A1, a strip-shaped area which is located on the right side of the display area DA and which extends in the second direction Y is called a second area A2, a strip-shaped area which is located on the lower side of the display area DA and which extends in the first direction X is called a third area A3, and a strip-shaped area which is located on the upper side of the display area DA and which extends in the first direction X is called a fourth area A4.

The display panel PNL comprises gate drivers GD1 and GD2, and a source driver SD. The gate drivers GD1 and GD2 are configured to drive gate lines which will be described later, the gate driver GD1 is disposed in the first area A1, and the gate driver GD2 is disposed in the second area A2. The source driver SD is configured to drive a source line which will be described later, and is disposed in the third area A3. The pad group is an outer lead bonding pad group and is disposed in the third area A3. The pads included in the pad group are electrically connected to the gate drivers GD1 and GD2, the source driver SD, and the like.

The circuit board CB is physically connected to the third area A3 of the first substrate SUB1 and is electrically connected to a plurality of pads of the pad groups PG. The IC chip I1 is mounted on the circuit board CB. Unlike the present embodiment, however, the IC chip I1 may be mounted on an area which is not opposed to the second substrate SUB2, of the third area A3 of the first substrate SUB1. The IC chip I1 can supply signals to the gate drivers GD1 and GD2, the source driver SD, and the like via the circuit board CB etc.

Figure 2:
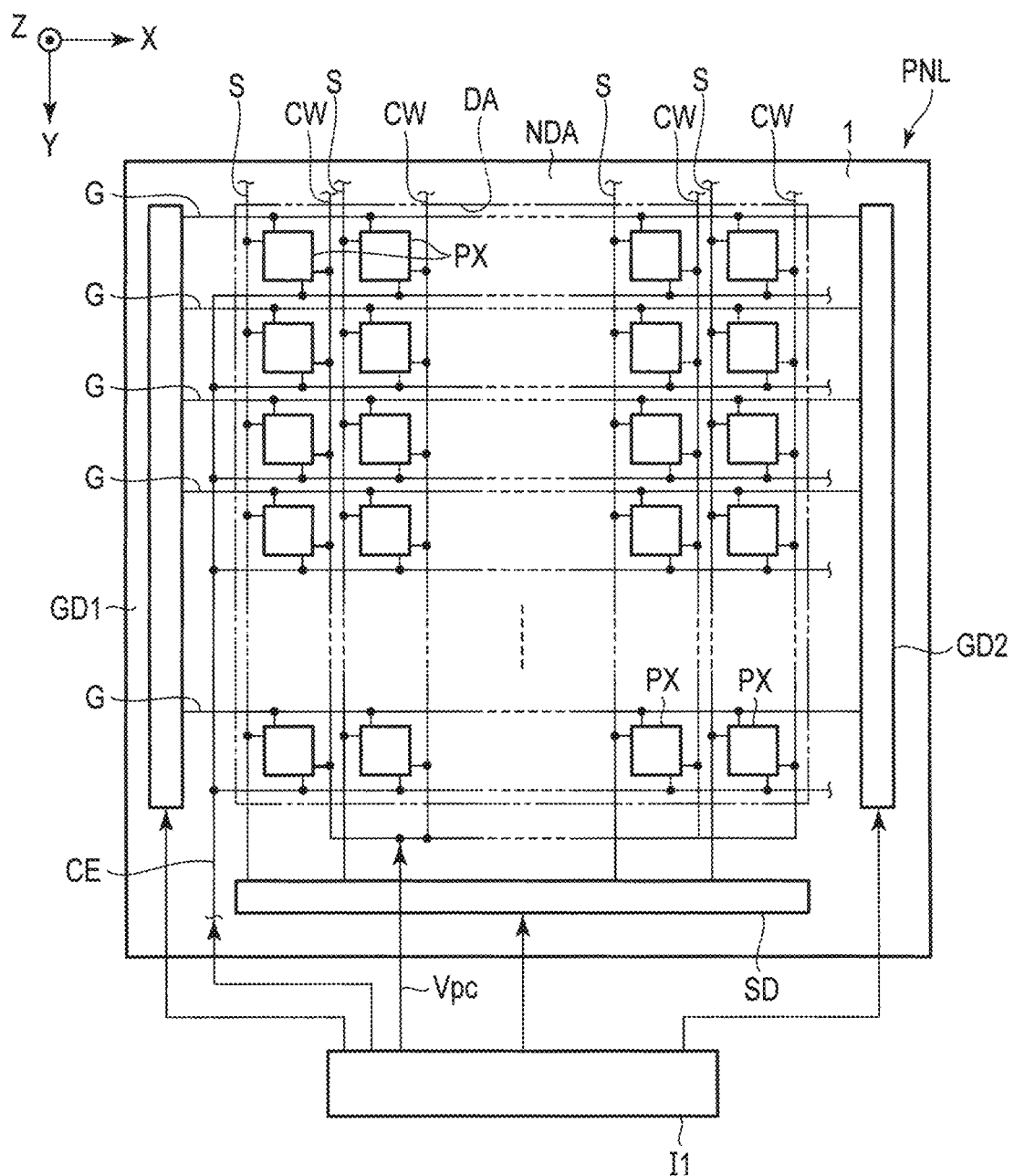
FIG. 2 is a circuit diagram showing the display device.
Figure 3:
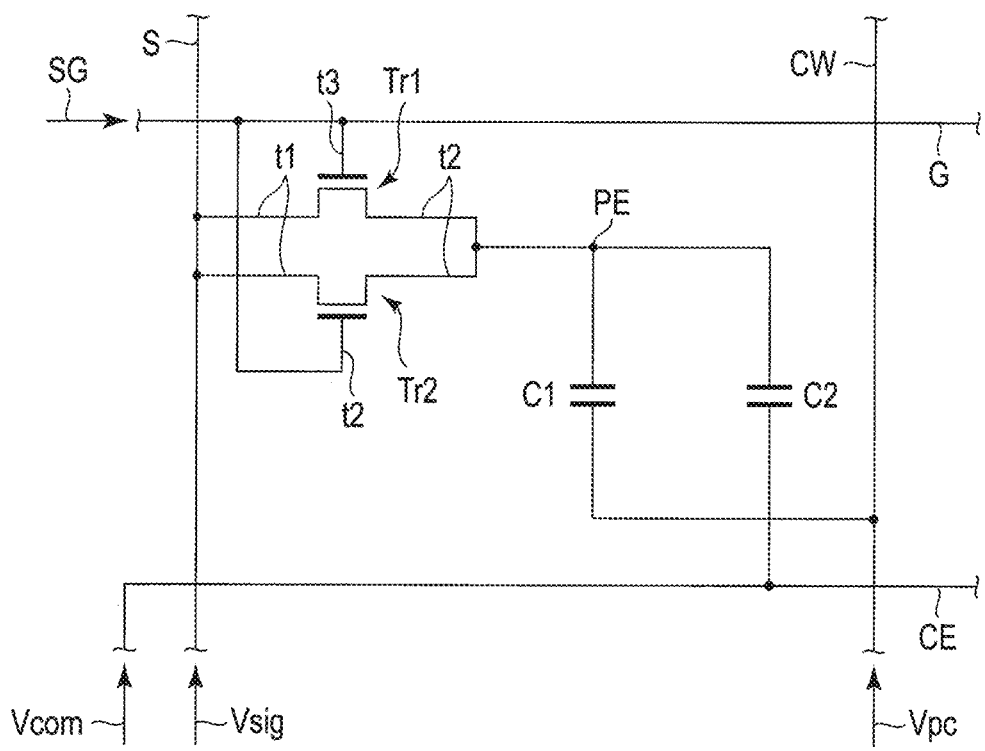
FIG. 3 is an equivalent circuit diagram showing a pixel shown in FIG. 2.

FIG. 2 is a circuit diagram showing a display device DSP. FIG. 3 is an equivalent circuit diagram showing one of the pixels PX shown in FIG. 2. It should be noted that FIG. 2 does not show all pixels PX and all lines.

As shown in FIG. 2 and FIG. 3, the display panel PNL comprises a first basement 1, a plurality of pixels PX arranged in a matrix, above the first basement 1, in the display area DA, a plurality of gate lines G, a plurality of source lines S, and a plurality of capacitive lines CW.

The gate lines G are connected to the gate drivers GD, extend in the first direction X, and are electrically connected to the pixels PX arranged in the first direction X. The source lines S are connected to the source driver SD, extend in the second direction Y, and are electrically connected to the pixels PX arranged in the second direction Y. The capacitive lines CW extend in the first direction X or the second direction Y. In the present embodiment, the capacitive lines CW extend in the second direction Y and are electrically connected to the pixels PX arranged in the second direction Y. The capacitive lines CW are bundled in the non-display area NDA and connected to the IC chip I1.

The gate drivers GD are configured to supply control signals SG to the gate lines G and to drive the gate lines G. The source driver SD is configured to supply image signals (for example, video signals) Vsig to the source lines S and to drive the source lines S. The IC chip I1 supplies a constant voltage Vpc to the capacitive lines CW such that the capacitive lines CW are fixed to a constant potential. In addition, the IC chip I1 supplies a common voltage Vcom to a counter-electrode CE such that the counter-electrode CE is fixed to a constant potential (common potential). In the present embodiment, the counter-electrode CE may be referred to as a common electrode since the counter-electrode CE is shared by all the pixels PX. In the present embodiment, the capacitive lines CW are set to the same potential as the counter-electrode CE but may be set to a potential different from the counter-electrode CE. The gate driver GD, the source driver SD, and the IC chip I1 constitute a driving unit configured to drive the pixels PX.

Each of the pixels PX comprises a first transistor Tr1, a second transistor Tr2, a first capacitance C1, and a second capacitance C2. The first transistor Tr1 and the second transistor Tr2 are configured by thin-film transistors (TFT) of the same conductive type, for example, P-channel type. A semiconductor layer of each of the first transistor Tr1 and the second transistor Tr2 is formed of an oxide semiconductor. As the semiconductor layer, polycrystalline silicon such as low-temperature polycrystalline silicon, amorphous silicon, or a semiconductor other than an oxide semiconductor may be used. Each of the first transistor Tr1 and the second transistor Tr2 may be constituted by N-channel TFT. Subsequent descriptions will be made in relation to the transistor Tr using an oxide semiconductor.

Each of the first transistor Tr1 and the second transistor Tr2 includes a first terminal t1, a second terminal t2, and a control terminal t3. In the present embodiment, the control terminal t3 functions as a gate electrode, either of the first terminal t1 and the second terminal t2 functions as a source electrode, and the other of the first terminal t1 and the second terminal t2 functions as a drain electrode. The first transistor Tr1 and the second transistor Tr2 are electrically connected parallel between the source line S and the pixel electrode PE.

In each of the first transistor Tr1 and the second transistor Tr2, the first terminal t1 is connected to the source line S, the second terminal t2 is connected to the pixel electrode PE, and the control terminal t3 is connected to the gate line G. Each of the first transistor Tr1 and the second transistor Tr2 is switched to a conductive state or a non-conductive state by the control signal SG supplied to the gate line G. The image signal Vsig is supplied to the pixel electrode PE via the source line S and the transistors Tr1 and Tr2 in the conductive state.

Each of the first capacitance C1 and the second capacitance C2 is a capacitor. The first capacitance C1 is connected between the pixel electrode PE and the capacitive line CW. The second capacitance C2 is connected between the pixel electrode PE and the counter-electrode CE.

Figure 4:
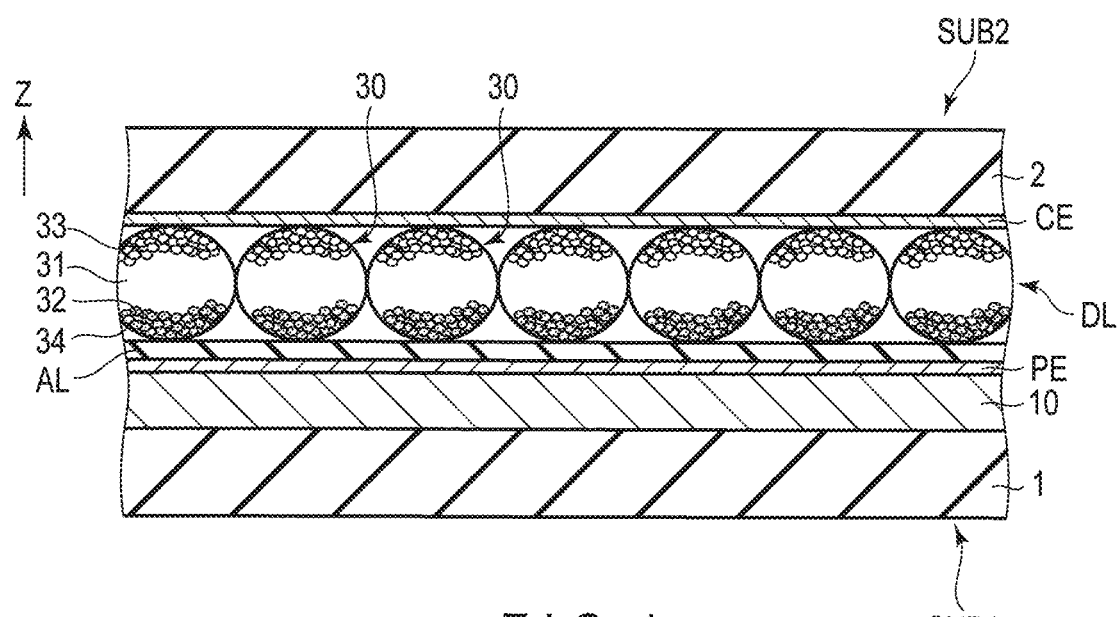
FIG. 4 is a cross-sectional view showing a display panel of the display device.

FIG. 4 is a cross-sectional view showing the display panel PNL. One of the pixels PX will be focused here.

As shown in FIG. 4, the first substrate SUB1 comprises a first basement 1, an underlying layer 10 provided on the first basement 1, and the pixel electrode PE provided on the underlying layer 10. The second substrate SUB2 comprises a second basement 2 opposed to the pixel electrode PE, and the counter-electrode CE located between the second basement 2 and the pixel electrode PE and opposed to the pixel electrode PE. The counter-electrode CE is formed of a transparent conductive material such as indium tin oxide (ITO) or indium zinc oxide (IZO).

In the present embodiment, the first substrate SUB1 is a semiconductor substrate and the second substrate SUB2 is a counter-substrate. The first basement 1 and the second basement 2 are formed of an insulating material such as resin and glass. In the present embodiment, the second basement 2 is located on a screen side (observation side) and has optical transparency. Since the first basement is located on a side opposite to the screen, the first basement may be untransparent or transparent.

A display function layer DL of the display panel PNL is located between the pixel electrode PE and the counter-electrode CE. A voltage applied between the pixel electrode PE and the counter-electrode CE is applied to the display function layer DL. In the present embodiment, the display device DSP is an electrophoretic display device, and the display function layer DL is an electrophoretic layer. The display function layer DL is formed of microcapsules 30 arranged with almost no gaps in the X-Y plane.

An adhesive layer AL of the display panel PNL is located between the pixel electrode PE and the display function layer DL.

The microcapsules 30 are spherical bodies having a particle diameter of, for example, approximately 20 to 70 µm. In the example illustrated, a number of microcapsules 30 are arranged between one pixel electrode PE and the counter-electrode CE, due to the constraints of a scale of the drawing, but approximately one to ten microcapsules 30 are arranged in the pixel PX of a rectangular shape or a polygonal shape in which one side has a length of approximately one hundred to several hundreds of µm (micrometers).

The microcapsule 30 comprises a dispersion medium 31, black particles 32, and white particles 33. The black particles 32 and the white particles 33 are often referred to as electrophoretic particles. An outer shell portion (a wall film) 34 of the microcapsule 30 is formed by using, for example, a transparent resin such as acrylic resin. The dispersion medium 31 is a liquid for dispersing the black particles 32 and the white particles 33 in the microcapsule 30. The black particles 32 are, for example, particles (high polymers or colloids) formed of black pigments such as aniline black, and are, for example, positively charged. The white particles 33 are, for example, particles (high polymers or colloids) formed of white pigments such as titanium dioxide, and are, for example, negatively charged. Various additives may be added to these types of pigments as needed. In addition, for example, pigments having colors such as red, green, blue, yellow, cyan, and magenta may be used instead of the black particles 32 and the white particles 33.

In the display function layer DL having the above configuration, when the pixel PX is urged to perform black display, the pixel electrode PE is held at a relatively higher potential than the counter-electrode CE. That is, when a potential of the counter-electrode CE is referred to as a reference potential, the pixel electrode PE is held in positive polarity. Thus, the negatively charged white particles 33 are attracted to the pixel electrode PE while the positively charged black particles 32 are attracted to the counter-electrode CE. As a result, black color is recognized when the pixel PX is observed from the counter-electrode CE side. Meanwhile, in a case where the pixel PX is urged to perform white display, the pixel electrode PE is held in negative polarity when a potential of the counter-electrode CE is referred to as the reference potential. Thus, the positively charged black particles 32 are attracted to the pixel electrode PE while the negatively charged white particles 33 are attracted to the counter-electrode CE side. As a result, white color is virtually recognized when the pixel PX is observed.

In the present embodiment, the pixel electrode PE is in contact with the adhesive layer AL. However, an insulating protective layer may be interposed between the pixel electrode PE and the adhesive layer AL, and the pixel electrode PE may be protected by the protective layer.

Figure 5:
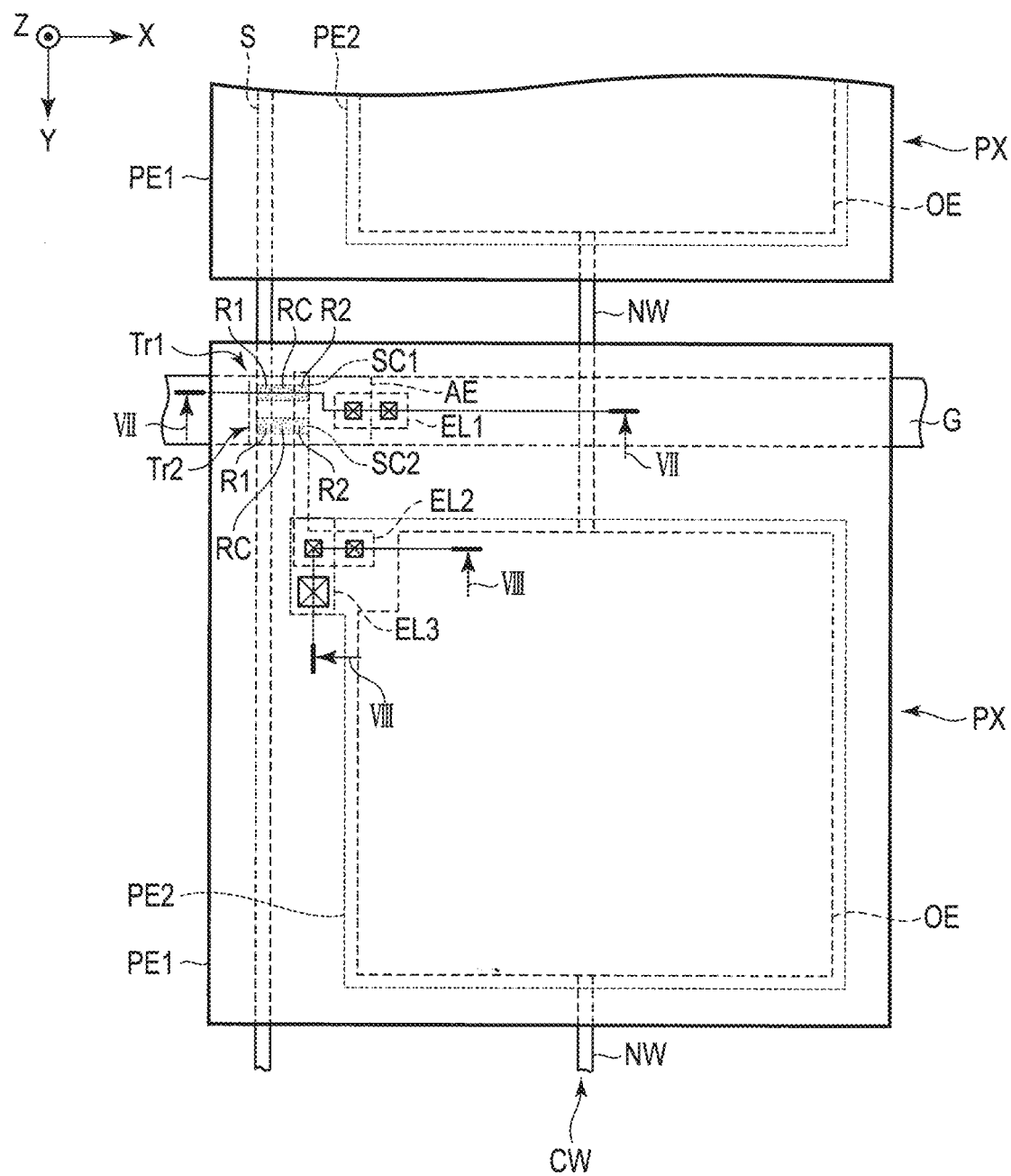
FIG. 5 is an enlarged plan view showing parts of a first substrate of the display device.

FIG. 5 is an enlarged plan view showing parts of the first substrate SUB1 of the display device DSP.

As shown in FIG. 5, the gate line G extends in the first direction X. The source line S extends in the second direction Y to cross the gate line G. The pixel electrode PE comprises a first pixel electrode PE1 and a second pixel electrode PE2 that are electrically connected to each other. The gate line G and the source line S cross the first pixel electrode PE1. The second pixel electrode PE2 is spaced apart from the gate lines G, in the second direction Y.

Each of a first semiconductor layer SC1 of the first transistor Tr1 and a second semiconductor layer SC2 of the second transistor Tr2 includes a first region R1 electrically connected to the source line S, a second region R2 electrically connected to the pixel electrode PE, and a channel region RC between the first region R1 and the second region R2. The whole channel region RC of each of the first semiconductor layer SC1 and the second semiconductor layer SC2 overlaps the same gate line G. In the present embodiment, the whole first semiconductor layer SC1 and the whole second semiconductor layer SC2 are made to overlap the same gate line G.

A first connection electrode EL1 overlaps the gate line G and is located to be spaced apart from the source line S in the first direction X.

The second connection electrode EL2 extends in the second direction Y. An end part of the second connection electrode EL2 is located between the source line S and the first connection electrode EL1 to overlap the second region R2 of each of the semiconductor layers SC, in the area overlapping the gate line G. The other end part of the second connection electrode EL2 overlaps the second pixel electrode PE2.

A capacitive electrode OE is located to be spaced apart from the semiconductor layers SC, the source line S, the first connection electrode EL1, and the second connection electrode EL2 and overlaps each of the first pixel electrode PE1 and the second pixel electrode PE2. In the present embodiment, the whole capacitive electrode OE is located inside the first pixel electrode PE1 and is located inside the second pixel electrode PE2, in planar view.

A connection line NW extends in the second direction Y, crosses the gate line G but does not cross the source line S. The connection line NW connects two capacitive electrodes OE adjacent to each other in the second direction Y across the gate line G. In the present embodiment, a plurality of connection lines NW and a plurality of capacitive electrodes OE arranged in the second direction Y are integrally formed to form the capacitive lines CW.

An auxiliary gate electrode AE overlaps each semiconductor layer SC and the first connection electrode EL1. In planar view, the auxiliary gate electrode AE may overlap at least the whole channel regions RC of both the first semiconductor layer SC1 and the second semiconductor layer SC2. In the present embodiment, the auxiliary gate electrode AE overlaps the whole first semiconductor layer SC1 and the whole second semiconductor layer SC2.

A third connection electrode EL3 is located to be spaced apart from the auxiliary gate electrode AE and overlaps the second connection electrode EL2 and the first pixel electrode PE1.

The gate line G and the second pixel electrode PE2 are formed of the same material. The source line S, the first connection electrode EL1, the second connection electrode EL2, the capacitive electrode OE, and the connection line NW are formed of the same material. The auxiliary gate electrode AE and the third connection electrode EL3 are formed of the same material. The gate line G, the second pixel electrode PE2, the source line S, the first connection electrode EL1, the second connection electrode EL2, the capacitive electrode OE, the connection line NW, the auxiliary gate electrode AE, and the third connection electrode EL3 may be formed of a metal material such as aluminum (Al), titanium (Ti), silver (Ag), molybdenum (Mo), tungsten (W), copper (Cu) and chromium (Cr) or an alloy of a combination of these metal materials and may have a single-layer structure or a multilayer structure.

Figure 6:
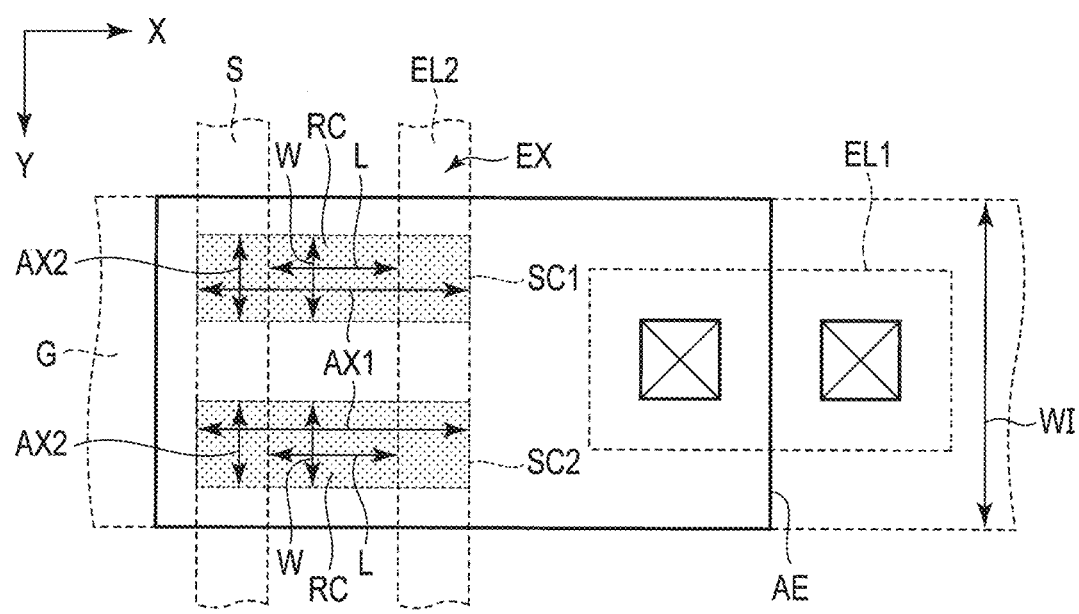
FIG. 6 is a further enlarged plan view showing parts of the first substrate of FIG. 5, illustrating a gate line, a first semiconductor layer, a second semiconductor layer, a source line, a first connection electrode, a second connection electrode, and an auxiliary gate electrode.

FIG. 6 is a further enlarged plan view showing parts of the first substrate SUB1 of FIG. 5, illustrating the gate line G, the first semiconductor layer SC1, the second semiconductor layer SC2, the source line S, the first connection electrode EL1, the second connection electrode EL2, and the auxiliary gate electrode AE.

As shown in FIG. 6, each of the first semiconductor layer SC1 and the second semiconductor layer SC2 has a longer axis AX1 in the first direction X in which the gate line G extends, and a shorter axis AX2 in the second direction Y. In the present embodiment, the first semiconductor layer SC1 and the second semiconductor layer SC2 are arranged side by side in the width direction (i.e., the second direction Y) of the gate line G. A width WI of the gate line G is larger than a sum of the length of the shorter axis AX2 of the first semiconductor layer SC1 and the length of the shorter axis AX2 of the second semiconductor layer SC2.

For example, the shorter axis AX2 (channel width W) of each of the first semiconductor layer SC1 and the second semiconductor layer SC2 is 1.5 µm long, the width WI of the gate lines G is 11 µm long, and the width WI of the gate line G is set to be substantially larger than twice of the sum of the length of the shorter axis AX2 of the first semiconductor layer SC1 and the length of the shorter axis of the second semiconductor layer SC2. By setting the width WI of the gate line G to be larger than the sum of the length of the shorter axis AX2 of the first semiconductor layer SC1 and the length of the shorter axis AX2 of the second semiconductor layer SC2, the whole bodies of the first semiconductor layer SC1 and the second semiconductor layer SC2 can be provided within the width WI of the gate lines G even when displacement occurs in manufacturing.

In addition, in the structure shown in FIG. 6, the second connection electrode EL2 has an extending end part EX that extends in the second direction Y to the side opposite to the second semiconductor layer SC2 across the first semiconductor layer SC1. For example, when the extending end part EX of the second connection electrode EL2 is provided inside with respect to the first semiconductor layer SC1 due to displacement in manufacturing, originally necessary properties of the first transistor Tr1 are assumed to be inadequate or the properties of the first transistor Tr1 and the second transistor Tr2 are assumed to be different. Since the extending end part EX of the second connection electrode EL2 has the structure of extending across the first semiconductor layer SC1, variation in the properties of the transistors caused by displacement can be prevented.

The channel length and channel width of each of the first semiconductor layer SC1 and the second semiconductor layer SC2 in the channel region RC are referred to as L and W, respectively. In the present embodiment, it is desirable that W/L≤0.75. A relationship between the channel length (L) and the channel width (W) will be described later.

Figure 7:
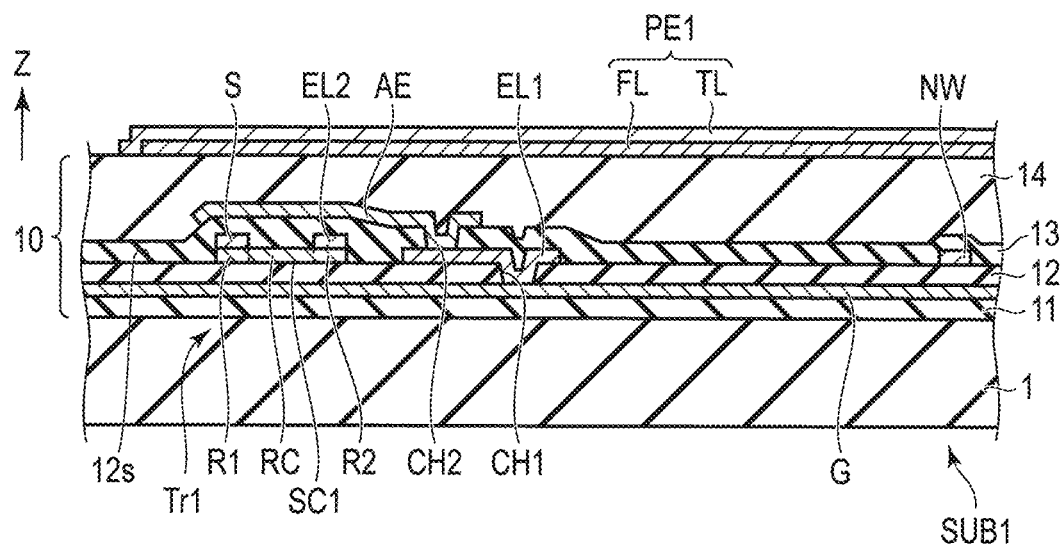
FIG. 7 is a cross-sectional view showing the first substrate viewed along line VII-VII in FIG. 5.
Figure 8:
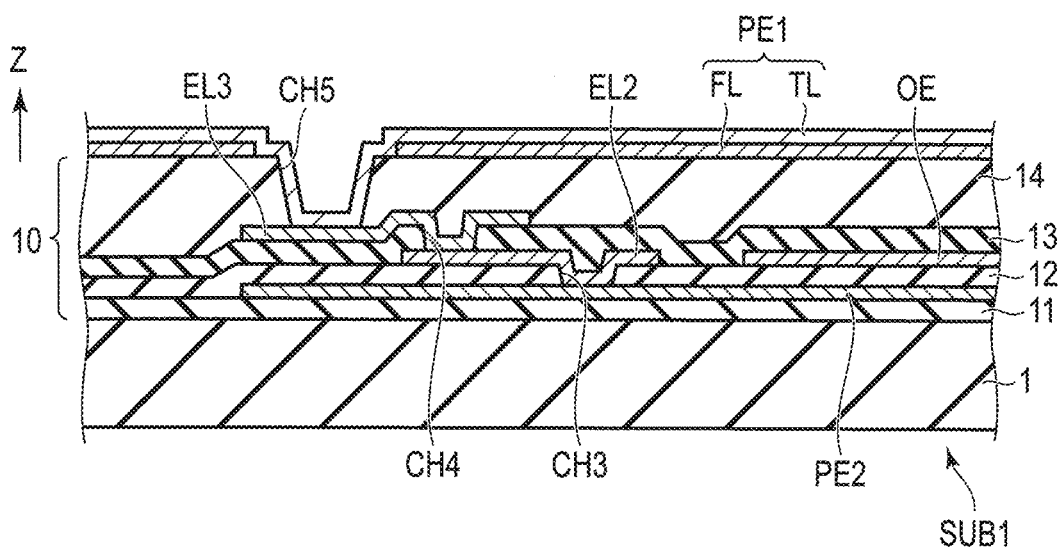
FIG. 8 is a cross-sectional view showing the first substrate viewed along line VIII-VIII in FIG. 5.

Next, a sectional structure of the display panel PNL will be described. FIG. 7 is a cross-sectional view showing the first substrate SUB1 as viewed along line VII-VII in FIG. 5. FIG. 8 is a cross-sectional view showing the first substrate SUB1 as viewed along line VIII-VIII in FIG. 5.

As shown in FIG. 7, an insulating layer 11 is formed on a first basement 1. The gate line G is formed on the insulating layer 11. An insulating layer 12 is formed on the insulating layer 11 and the gate line G.

A semiconductor layer SC such as the first semiconductor layer SC1 is provided on the insulating layer 12. The insulating layer 12 has a first surface 12s that is a surface on the source line S side. The semiconductor layer SC such as the first semiconductor layer SC1 is in contact with the first surface 12s. The source line S, the first connection electrode EL1, the second connection electrode EL2, and the connection line NW are provided on the insulating layer 12 on which the semiconductor layer SC is formed. The source line S is located on the first region R1 of the semiconductor layer SC such as the first semiconductor layer SC1, is in contact with the first region R1, and is electrically connected to the first region R1. The second connection electrode EL2 is located on the second region R2 of the semiconductor layer SC such as the first semiconductor layer SC1, is in contact with the second region R2, and is electrically connected to the second region R2. The first connection electrode EL1 is electrically connected to the gate line G. The first connection electrode EL1 is in contact with the gate line G through the first contact hole CH1 formed in the insulating layer 12.

An insulating layer 13 is formed on the insulating layer 12 on which the semiconductor layer SC, the source line S, the first connection electrode EL1, the second connection electrode EL2, and the connection line NW are formed. The auxiliary gate electrode AE is provided on the insulating layer 13, and is in contact with the first connection electrode EL1 through a contact hole CH2 formed in the insulating layer 13. The auxiliary gate electrode AE is electrically connected to the gate line G via the first connection electrode EL1.

The auxiliary gate electrode AE is opposed to at least the channel region RC of the semiconductor layer SC. The first semiconductor layer SC1 and the second semiconductor layer SC2 are sandwiched between the auxiliary gate electrode AE and the gate line G. For example, in the first transistor Tr1, each of the gate line G and the auxiliary gate electrode AE functions as a gate electrode. The first transistor Tr1 is a thin-film transistor having a dual-gate structure. A part of the gate line G, the first semiconductor layer SC1, the auxiliary gate electrode AE, and the like constitute the first transistor Tr1. The second transistor Tr2 has the same sectional structure as the first transistor Tr1. The gate line G, the source line S, and the auxiliary gate electrode AE are located above the first basement 1. The first transistor Tr1 and the second transistor Tr2 are also located above the first basement 1.

An insulating layer 14 is formed on the insulating layer 13 and the auxiliary gate electrode AE. The insulating layer 11, the insulating layer 12, and the insulating layer 13 all correspond to an inorganic insulating film formed of an inorganic insulating material such as silicon oxide (SiO), silicon nitride (SiN), or silicon oxynitride (SiON). The insulating layer 11, the insulating layer 12, and the insulating layer 13 may each have a single-layer structure or a laminated structure. The insulating layer 14 corresponds to an organic insulating layer formed of an organic insulating material such as acrylic resin. The above-described underlying layer 10 is composed of the insulating film 11 to the insulating layer 14, above the first basement 1.

The first pixel electrode PE1 is located above the first basement 1, the gate line G, and the source line S. In the present embodiment, the first pixel electrode PE1 is provided on the insulating layer 14. The first pixel electrode PE1 is composed of a stacked layer body of a light-reflective layer FL and a transparent conductive layer TL. The light-reflective layer FL is provided on the insulating layer 14. The light-reflective layer FL may be formed of a metal material such as Al, Ti, Ag, Mo, W, Cu, and Cr or an alloy formed by a combination of these metal materials, and may be formed to have a single-layer structure or a multi-layer structure. The light-reflective layer FL of the present embodiment is a light-reflecting conductive layer.

The transparent conductive layer TL is provided on the insulating layer 14 and the light-reflective layer FL and is in contact with the light-reflective layer FL. In the present embodiment, the size of the transparent conductive layer TL is larger than the size of the light-reflective layer FL, and the transparent conductive layer TL completely covers the upper and side surfaces of the light-reflective layer FL. The transparent conductive layer TL is in contact with the insulating layer 14 on the outside of the light-reflective layer FL. However, the sizes of the light-reflective layer FL and the transparent conductive layer TL are not limited to those in the present embodiment, but can be variously modified. For example, the size of the transparent conductive layer TL may be the same as the size of the light-reflective layer FL or the transparent conductive layer TL may be formed to completely overlap the light-reflective layer FL. In the present embodiment, the second capacitance C2 corresponds to capacitance formed between the first pixel electrode PE1 and the counter-electrode CE.

As shown in FIG. 8, the second pixel electrode PE2 is located between the first basement 1 and the first pixel electrode PE1. In the present embodiment, the second pixel electrode PE2 is provided on the insulating layer 11 and is covered with the insulating layer 12. The second connection electrode EL2 is provided on the insulating layer 12 and is covered with the insulating layer 13. The second connection electrode EL2 is in contact with the second pixel electrode PE2 through the contact hole CH3 formed in the insulating layer 12.

The capacitive electrode OE is located between the first pixel electrode PE1 and the second pixel electrode PE2. In the present embodiment, the capacitive electrode OE is provided on the insulating layer 12 and is covered with the insulating layer 13. The capacitive electrode OE is capacitively coupled to each of the first pixel electrode PE1 and the second pixel electrode PE2. The sum of the electrostatic capacitance formed between the first pixel electrode PE1 and the capacitive electrode OE and the electrostatic capacitance formed between the second pixel electrode PE2 and the capacitive electrode OE is equivalent to the first capacitance C1.

The third connection electrode EL3 is provided on the insulating layer 13 and is covered with the insulating layer 14. The third connection electrode EL3 is in contact with the second connection electrode EL2 through a contact hole CH4 formed in the insulating layer 13.

The light-reflective layer FL includes an opening that surrounds a contact hole CH5 formed in the insulating layer 14. The transparent conductive layer TL is in contact with the third connection electrode EL3 through the opening of the light-reflective layer FL and the contact hole CH5. Based on the above, the second pixel electrode PE2 is electrically connected to the first pixel electrode PE1 via the second connection electrode EL2 and the third connection electrode EL3.

As shown in FIG. 5, FIG. 7, and FIG. 8, the gate line G and the second pixel electrode PE2 are formed of the same material and located in the same layer. The source line S, a plurality of capacitive electrodes OE, a plurality of connection lines NW, the first connection electrode EL1, and the second connection electrode EL2 are formed of the same material and located in the same layer. The auxiliary gate electrode AE and the third connection electrode EL3 are formed of the same material and located in the same layer.

Next, the relationship between the channel length (L) and the channel width (W) of each of the semiconductor layers SC will be described. FIG. 9 is a table showing a determination result of varying the channel width (W) and the channel length (L) of each semiconductor layer SC shown in FIG. 6, and the W/L value. In the table, the W/L values are parenthesized.

As shown in FIG. 9, the determination is referred to as A or B as a result of determining various type of transistors Tr under the same conditions. In the determination, for example, the same current were made to flow to various types of transistors Tr. The determination was referred to as A when the transistors Tr functioned as switches without being broken. In contrast, the determination was referred to as B when the transistors Tr were broken and did not function as switches. It is supposed that an excessive current flowed to the transistors Tr and the transistors Tr were broken due to thermal degradation.

For example, Patent Literature 3 and Patent Literature 4 of the Prior Art Documents disclose an electrophoretic device in which a high voltage of 30V or more is required to move particles in microcapsules. Evaluation was made by, for example, making a current of a high voltage of 30V or more flow to a gate and a source of one transistor Tr using the oxide semiconductor, under the conditions shown in FIG. 9.

When the W/L values were 0.75 or less, all results were determination A. For this reason, the W/L values should desirably be set to 0.75 or less.

According to the display device DSP according to the first embodiment configured as described above, the first substrate SUB1 comprises the first basement 1, the gate line G, the source line S, first pixel electrode PE1, and the first transistor Tr1 and the second transistor Tr2 located between the source line S and the first pixel electrode PE1 and connected parallel. For this reason, the pixel electrodes PE can be driven with a substantially double current while maintaining an allowable current made to flow to one transistor Tr as compared with a case of connecting one transistor between the source line S and the first pixel electrode PE1.

The semiconductor layer SC of each of the first transistor Tr1 and the second transistor Tr2 includes the first region R1, the second region R2, and the channel region RC. The first region R1 is electrically connected to the source line S. The second region R2 is electrically connected to the first pixel electrode PE1. The channel region RC is located between the first region R1 and the second region R2. Each semiconductor layer SC has the longer axis AX1 in the direction in which the gate line G extends and entirely overlaps the gate line G. For this reason, for example, when the width of the gate line G needs to be made larger to supply a high voltage control signal SG to the gate line G, the entire body of each semiconductor layer SC can be made to overlap the gate line G.

Based on the above, a semiconductor substrate and display device capable of driving with a plurality of current paths can be obtained. In the first embodiment, the first substrate SUB1 and the display device DSP capable of driving the pixel electrodes PE with the first semiconductor layer SC1 and the second semiconductor layer SC2 can be obtained.

Second Embodiment

Next, a display device DSP according to a second embodiment will be described. FIG. 10 is an enlarged plan view showing parts of a first substrate SUB1 of the display device DSP according to the second embodiment.

As shown in FIG. 10, the display device DSP of the second embodiment is different from the first embodiment with respect to a feature that a capacitive line CW extends in the first direction X. In the present embodiment, a plurality of connection lines NW and a plurality of capacitive electrodes OE arranged in the first direction X are electrically connected to form the capacitive line CW. The connection lines NW do not cross the gate line G but cross the source lines S.

Each of the connection lines NW is composed of a connection electrode NW1, a connection electrode NW2, and a crossed electrode NW3. The connection electrode NW1 is electrically connected to one of the capacitive electrodes OE and located to be spaced apart from the source line S. The connection electrode NW2 is electrically connected to the other capacitive electrode OE and located to be spaced apart from the source line S. In the present embodiment, the connection electrode NW1 is formed integrally with one of the capacitive electrodes OE, and the connection electrode NW2 is formed integrally with the other capacitive electrode OE.

The crossed electrode NW3 crosses the source line S and is made to overlap the connection electrode NW1 and the connection electrode NW2. The width (i.e., length in the second direction Y) of the crossed electrode NW3 is smaller in the area crossing the source line S than in the area overlapping the connection electrode NW1 and the connection electrode NW2. For this reason, load on the source line S can be reduced as compared with a case where the width of the crossed electrode NW3 is not made smaller in the area crossing the source line S.

FIG. 11 is a cross-sectional view showing a first substrate SUB1 as viewed along line XI-XI in FIG. 10.

As shown in FIG. 11, the crossed electrode NW3 is provided on an insulating layer 11. The crossed electrode NW3 is formed of the same material, in the same layer, as the second pixel electrode PE2. The connection electrode NW1 and the connection electrode NW2 are provided on an insulating layer 12. The connection electrode NW1 and the connection electrode NW2 are formed of the same material, in the same layer, together with the capacitive electrode OE, a source line S, and the like. The connection electrode NW1 is in contact with the crossed electrode NW3 through a contact hole CH6 formed in the insulating layer 12. The connection electrode NW2 is in contact with the crossed electrode NW3 through a contact hole CH7 formed in the insulating layer 12.

In the display device DSP according to the second embodiment configured as described above, too, the same advantages as those obtained in the first embodiment can be obtained. The capacitive line CW does not cross the gate line G. For this reason, load on the gate line G can be reduced as compared with a case where the capacitive line CW crosses the gate line G. The driving ability of the gate line G can be thereby further enhanced.

Third Embodiment

Figure 12:
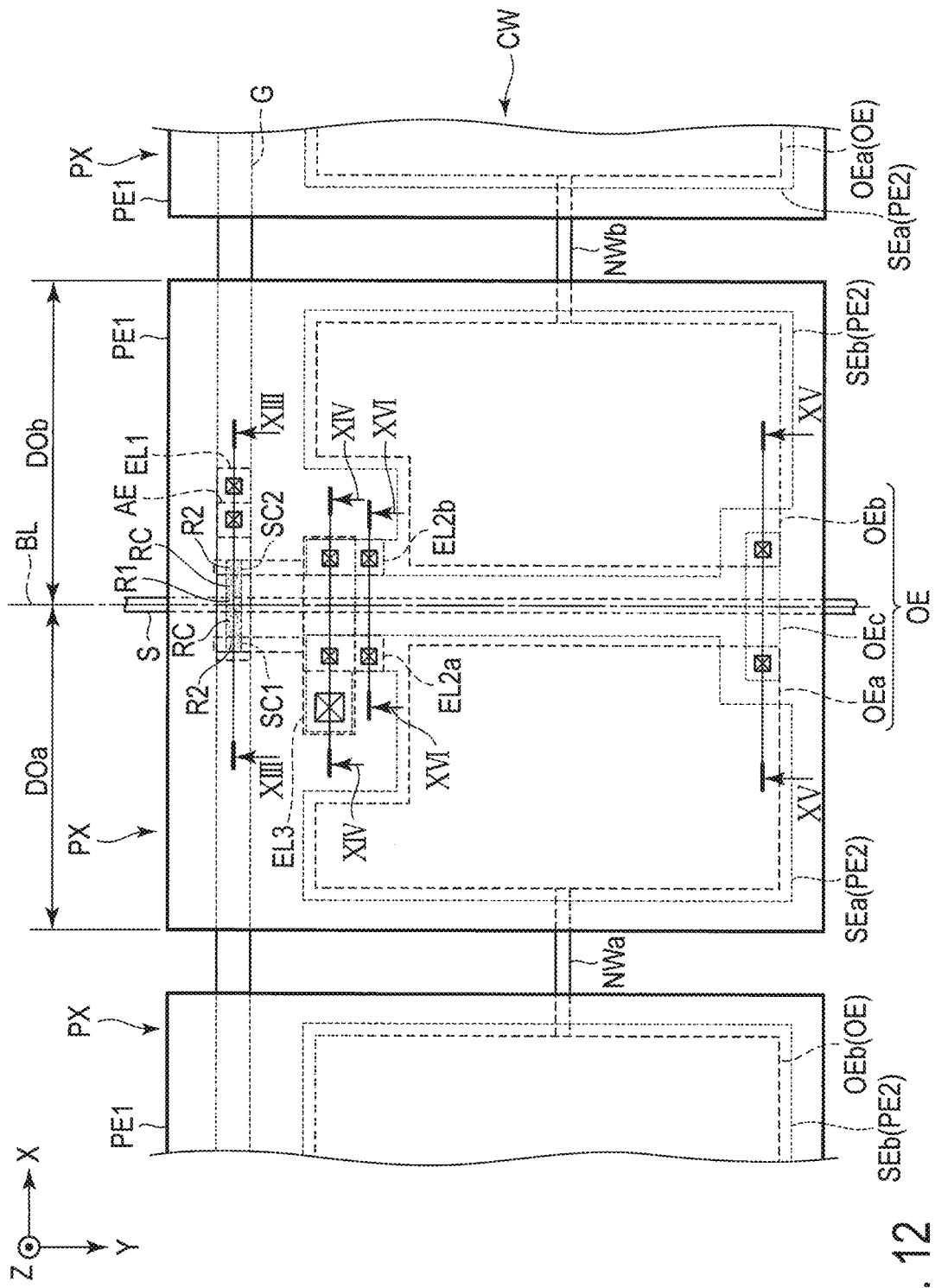
FIG. 12 is an enlarged plan view showing parts of a first substrate of a display device according to a third embodiment.

Next, a display device DSP according to a third embodiment will be described. FIG. 12 is an enlarged plan view showing parts of a first substrate SUB1 of the display device DSP according to the third embodiment.

As shown in FIG. 12, the display device DSP of the third embodiment is different from the first embodiment with respect to features that a source line S extends vertically at the center of a pixel PX, that a capacitive line CW extends in the first direction X, that a first semiconductor layer SC1 and a second semiconductor layer SC2 are formed integrally and arranged in the first direction X, and that each of a second pixel electrode PE2 and a capacitive electrode OE is divided in the first direction X. For example, a connection line NW is formed of the same material as the capacitive electrode OE, and located in the same layer as the capacitive electrode OE. An area overlapping a first pixel electrode PE1 is classified into a first domain DOa and a second domain DOb adjacent in the first direction X.

The second pixel electrode PE2 includes a first segment SEa and a second segment SEb. The first segment SEa is located in the first domain DOa and is located to be spaced apart from the gate line G. The second segment SEb is located in the second domain DOb and is located to be spaced apart from each of the gate line G and the first segment SEa.

The first semiconductor layer SC1 and the second semiconductor layer SC2 are arranged in the first direction X. A second region R2 and a channel region RC of the first semiconductor layer SC1 are located in the first domain DOa. A second region R2 and a channel region RC of the second semiconductor layer SC2 are located in the second domain DOb. A first region R1 of the first semiconductor layer SC1 and a first region R1 of the second semiconductor layer SC2 are formed integrally to overlap the source line S. In the present embodiment, the whole bodies of the first semiconductor layer SC1 and the second semiconductor layer SC2 formed integrally are made to overlap the same gate line G.

The source line S crosses the gate line G and is located on a boundary BL between the first domain DOa and the second domain DOb.

A first connection electrode EL1 is located in the first domain DOa or the second domain Dab, made to overlap the gate line G, and located to be spaced apart from the source line S in the first direction X. In the present embodiment, the first connection electrode EL1 is located in the second domain DOb.

A second connection electrode EL2a is located in the first domain DOa, extends in the second direction Y, and is located to be spaced apart from the source line S. An end part of the second connection electrode EL2a overlaps the second region R2 of the first semiconductor layer SC1 in the area overlapping the gate line G. The other end part of the second connection electrode EL2a is made to overlap the first segment SEa and is electrically connected to the first segment SEa.

A second connection electrode EL2b is located in the second domain Dab, extends in the second direction Y, and is located to be spaced apart from the source line S. An end part of the second connection electrode EL2b is located between the source line S and the first connection electrode EL1 to overlap the second region R2 of each of the second semiconductor layer SC2, in the area overlapping the gate line G. The other end part of the second connection electrode EL2b is made to overlap the second segment SEb and is electrically connected to the second segment SEb.

The capacitive electrode OE includes a first capacitive electrode OEa, a second capacitive electrode OEb, and a crossed electrode OEc. The crossed electrode OEc crosses the source line S, and is located to be spaced apart from each of the first segment SEa and the second segment SEb.

The first capacitive electrode OEa is located in the first domain DOa, made to overlap each of the first segment SEa, the crossed electrode OEc, and the first pixel electrode PE1, and located to be spaced apart from each of the second connection electrode EL2a and the source line S.

The second capacitive electrode OEb is located in the second domain Dab, made to overlap each of the second segment SEb, the crossed electrode OEc, and the first pixel electrode PE1, and located to be spaced apart from each of the first connection electrode EL1, the second connection electrode EL2b, and the source line S.

In the following descriptions of FIG. 12, the capacitive electrode OE of the central pixel PX, of three pixels PX arranged in the first direction X, is simply referred to as the capacitive electrode OE, the capacitive electrode OE of the pixel PX on the left side is referred to as another capacitive electrode OE, and the capacitive electrode OE of the pixel PX on the right side is referred to as a third capacitive electrode OE. The other capacitive electrode OE is adjacent to a first capacitive electrode OEa of the capacitive electrode OE. The third capacitive electrode OE is adjacent to the second capacitive electrode OEb. The capacitive electrode OE is located between the other capacitive electrode OE and the third capacitive electrode OE.

Each of a connection line NWa and a connection line NWb extends in the first direction X, and does not cross the gate line G or the source line S. The connection line NWa connects the first capacitive electrode OEa of the capacitive electrode OE to the other capacitive electrode OE. The connection line NWb connects the second capacitive electrode OEb of the capacitive electrode OE to the third capacitive electrode OE.

In the present embodiment, a plurality of connection lines NW and a plurality of capacitive electrodes OE arranged in the first direction X are connected to form a capacitive line CW.

An auxiliary gate electrode AE overlaps each semiconductor layer SC and the first connection electrode EL1. In planar view, the auxiliary gate electrode AE may overlap at least the whole channel regions RC of both the first semiconductor layer SC1 and the second semiconductor layer SC2. In the present embodiment, the auxiliary gate electrode AE overlaps the whole first semiconductor layer SC1 and the whole second semiconductor layer SC2. In addition, in the present embodiment, the auxiliary gate electrode AE crosses the source line S.

A third connection electrode EL3 is located to be spaced apart from the auxiliary gate electrode AE and overlaps the second connection electrode EL2a, the second connection electrode EL2b, and the first pixel electrode PE1.

When the boundary BL is referred to as an axis of symmetry, a group of the first segment SEa, the second connection electrode EL2a, and the first capacitive electrode OEa is substantially arranged to have line symmetry with a group of the second segment SEb, the second connection electrode EL2b, and the second capacitive electrode OEb.

Figure 13:
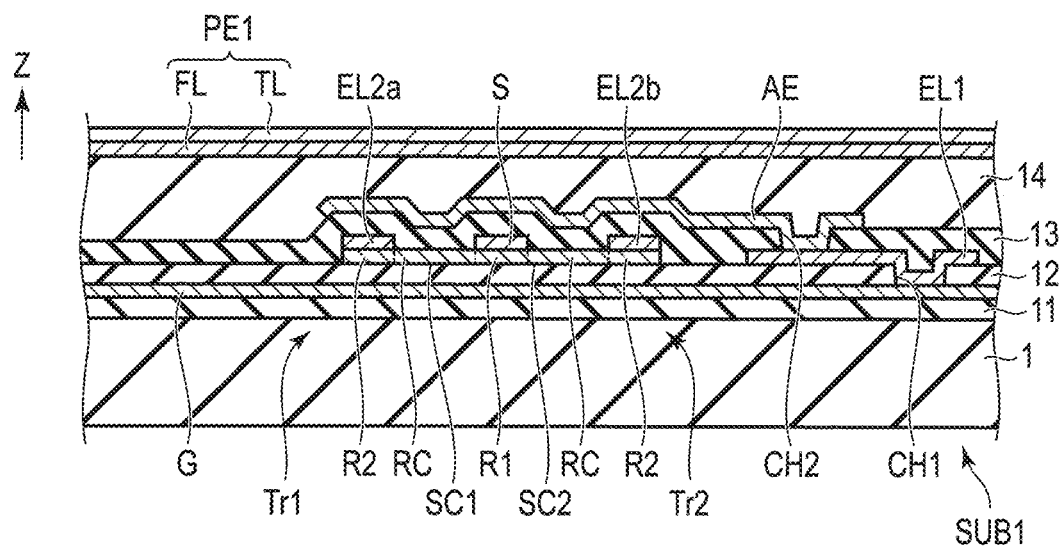
FIG. 13 is a cross-sectional view showing the first substrate viewed along line XIII-XIII in FIG. 12.
Figure 14:
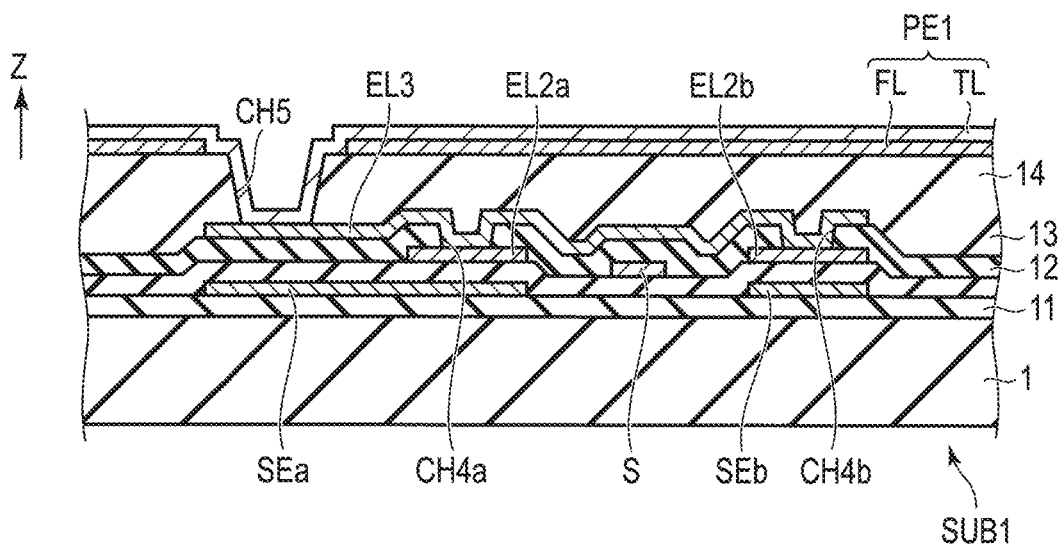
FIG. 14 is a cross-sectional view showing the first substrate viewed along line XIV-XIV in FIG. 12.
Figure 15:
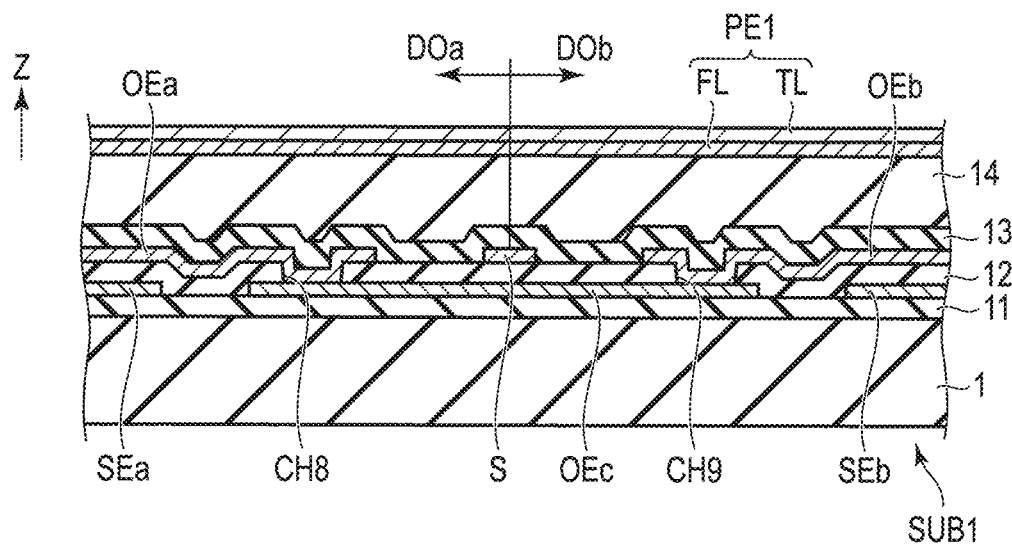
FIG. 15 is a cross-sectional view showing the first substrate viewed along line XV-XV in FIG. 12.

Next, a sectional structure of the display panel PNL will be described. FIG. 13 is a cross-sectional view showing the first substrate SUB1 as viewed along line XIII-XIII in FIG. 12. FIG. 14 is a cross-sectional view showing the first substrate SUB1 as viewed along line XIV-XIV in FIG. 12. FIG. 15 is a cross-sectional view showing the first substrate SUB1 as viewed along line XV-XV in FIG. 12.

As shown in FIG. 13, the first semiconductor layer SC1 and the second semiconductor layer SC2 are provided on the insulating layer 12 and formed integrally. The source line S is located on the first region R1 common to the first semiconductor layer SC1 and the second semiconductor layer SC2, is in contact with the first region R1, and is electrically connected to the first region R1. The second connection electrode EL2a is located on the second region R2 of the first semiconductor layer SC1, is in contact with the second region R2, and is electrically connected to the second region R2. The second connection electrode EL2b is located on the second region R2 of the second semiconductor layer SC2, is in contact with the second region R2, and is electrically connected to the second region R2. The insulating layer 13 covers the insulating layer 12, the source line S, the first connection electrode EL1, the second connection electrode EL2a, and the second connection electrode EL2b.

As shown in FIG. 14, the first segment SEa and the second segment SEb are provided on the insulating layer 11 and covered with the insulating layer 12. The source line S, the second connection electrode EL2a, and the second connection electrode EL2b are provided on the insulating layer 12 and covered with the insulating layer 13.

Figure 16:
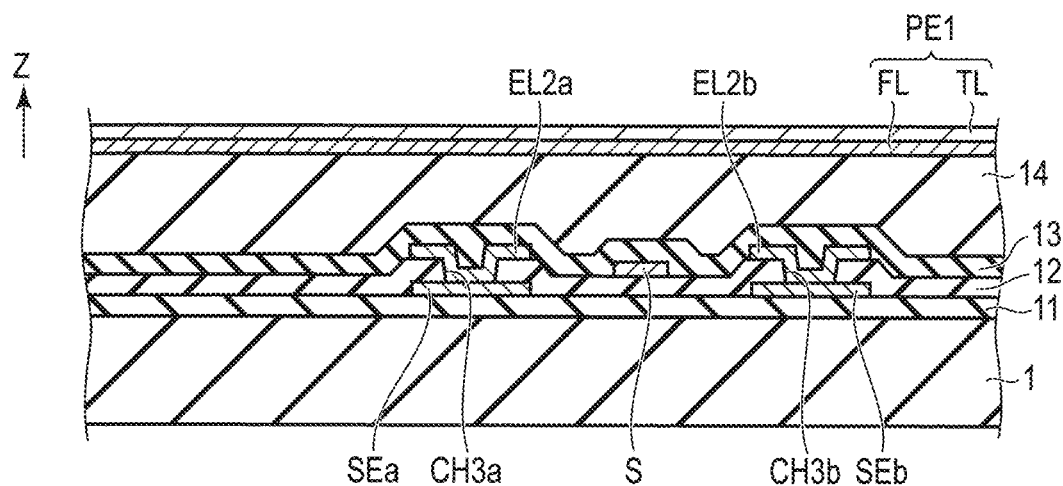
FIG. 16 is a cross-sectional view showing the first substrate viewed along line XVI-XVI in FIG. 12.

As shown in FIG. 16, the second connection electrode EL2a is opposed to the first segment SEa and is in contact with the first segment SEa via a contact hole CH3a formed in the insulating layer 12. The second connection electrode EL2b is opposed to the second segment SEb and is in contact with the second segment SEb via a contact hole CH3b formed in the insulating layer 12.

As shown in FIG. 14, the third connection electrode EL3 is provided on the insulating layer 13 and is covered with the insulating layer 14. The third connection electrode EL3 is in contact with the second connection electrode EL2a through a contact hole CH4a formed in the insulating layer 13 and is in contact with the second connection electrode EL2b through a contact hole CH4b formed in the insulating layer 13. The first pixel electrode PE1 is in contact with the third connection electrode EL3 through a contact hole CH5. Based on the above, the first segment SEa is electrically connected to the first pixel electrode PE1 via the second connection electrode EL2a and the third connection electrode EL3. The second segment SEb is electrically connected to the first pixel electrode PE1 via the second connection electrode EL2b and the third connection electrode EL3.

As shown in FIG. 15, the first segment SEa, the second segment SEb, and the crossed electrode OEc are provided on the insulating layer 11 and covered with the insulating layer 12. The first capacitive electrode OEa and the second capacitive electrode OEb are provided on the insulating layer 12 as well as the source line S. The first capacitive electrode OEa is opposed to the first segment SEa and the crossed electrode OEc and is contact with the crossed electrode OEc through a contact hole CH8 formed in the insulating layer 12. The second capacitive electrode OEb is opposed to the second segment SEb and the crossed electrode OEc and is contact with the crossed electrode OEc through a contact hole CH9 formed in the insulating layer 12. Based on the above, the crossed electrode OEc electrically connects the first capacitive electrode OEa and the second capacitive electrode OEb.

The source line S, the first capacitive electrode OEa, and the second capacitive electrode OEb are covered with the insulating layer 13. The insulating layer 14 and the first pixel electrode PE1 are sequentially provided on the insulating layer 13. In the first domain DOa, the first capacitive electrode OEa is located between the first segment SEa and the first pixel electrode PE1. In the second domain Dab, the second capacitive electrode OEb is located between the second segment SEb and the first pixel electrode PE1.

The first capacitive electrode OEa is capacitively coupled to each of the first segment SEa and the first pixel electrode PE1. The second capacitive electrode OEb is capacitively coupled to each of the second segment SEb and the first pixel electrode PE1. The sum of the electrostatic capacitance formed between the first pixel electrode PE1 and the first capacitive electrode OEa, the electrostatic capacitance formed between the first segment SEa and the first capacitive electrode OEa, the electrostatic capacitance formed between the first pixel electrode PE1 and the second capacitive electrode OEb, and the electrostatic capacitance formed between the first segment SEa and the second capacitive electrode OEb is equivalent to the first capacitance C1.

As shown in FIG. 12 to FIG. 16, the gate line G, the first segment SEa, the second segment SEb, and the crossed electrode OEc are formed of the same material and located in the same layer. The source line S, the first capacitive electrode OEa, the second capacitive electrode OEb, the connection line NW, the first connection electrode EL1, the second connection electrode EL2a, and the second connection electrode EL2b are formed of the same material and located in the same layer. The auxiliary gate electrode AE and the third connection electrode EL3 are formed of the same material and located in the same layer.

In the display device DSP according to the third embodiment configured as described above, too, the same advantages as those obtained in the second embodiment can be obtained. The capacitive electrode OE is divided into the first capacitive electrode OEa and the second capacitive electrode OEb, and the second pixel electrode PE2 is divided into the first segment SEa and the second segment SEb. Since the area of each of the capacitive electrodes constituting the first capacitance C1 can be reduced as compared with the second embodiment, breakage of the capacitance caused by electro-static discharge (ESD) can hardly occur.

Fourth Embodiment

Next, a display device DSP according to a fourth embodiment will be described. FIG. 17 is an enlarged plan view showing parts of a first substrate SUB1 of the display device DSP according to the fourth embodiment.

As shown in FIG. 17, the present embodiment is different from the first embodiment with respect to a configuration of a connection line NW. In the present embodiment, each connection line NW is composed of a connection electrode NW5, a connection electrode NW6, and a crossed electrode NW7. The connection electrode NW5 is electrically connected to one of the capacitive electrodes OE and located to be spaced apart from the gate line G. The connection electrode NW6 is electrically connected to the other capacitive electrode OE and located to be spaced apart from the gate line G. In the present embodiment, the connection electrode NW5 is formed integrally with one of the capacitive electrodes OE, and the connection electrode NW6 is formed integrally with the other capacitive electrode OE. The crossed electrode NW7 crosses the gate line G and is made to overlap the connection electrode NW5 and the connection electrode NW6.

Figure 18:
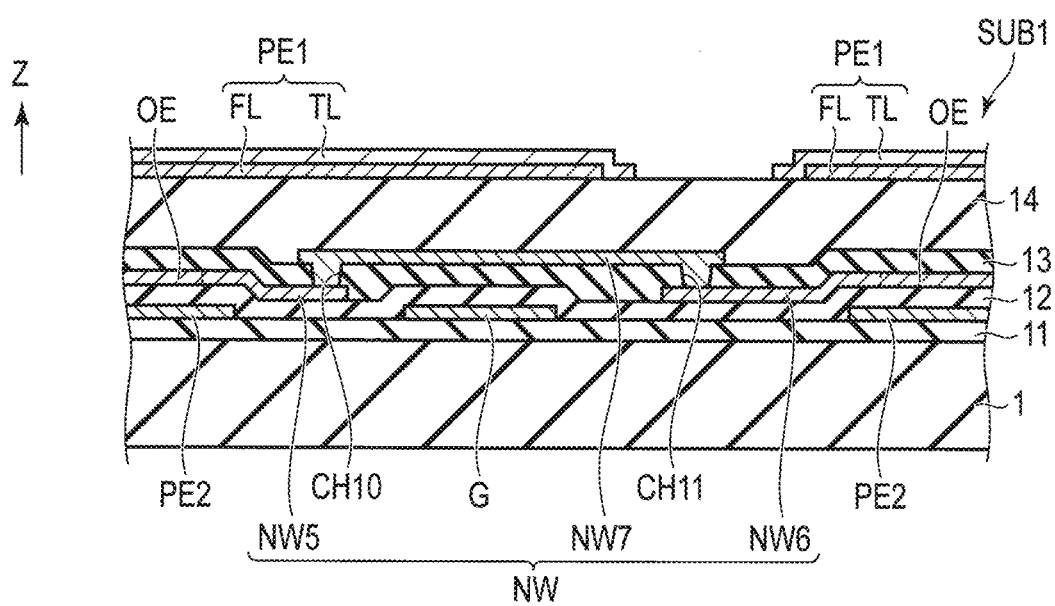
FIG. 18 is a cross-sectional view showing the first substrate viewed along line XVIII-XVIII in FIG. 17.

FIG. 18 is a cross-sectional view showing a first substrate SUB1 as viewed along line XVIII-XVIII in FIG. 17.

As shown in FIG. 18, the crossed electrode NW7 is located in a layer different from the layer in which each of the gate line G and the source line S is located. The crossed electrode NW7 is provided on an insulating layer 13. The crossed electrode NW7 is formed of the same material, in the same layer, as an auxiliary gate electrode AE and a third connection electrode EL3. The connection electrode NW5 and the connection electrode NW6 are provided on an insulating layer 12. The connection electrode NW5 and the connection electrode NW6 are formed of the same material, in the same layer, together with a capacitive electrode OE, the source line S, and the like. The crossed electrode NW7 is in contact with the connection electrode NW5 through a contact hole CH10 formed in the insulating layer 13 on one hand, and is in contact with the connection electrode NW6 through a contact hole CH11 formed in the insulating layer 13 on the other hand.

The crossed electrode NW7 is not provided on the insulating layer 12, but on the insulating layer 13. Load on the gate line G can be reduced as compared with a case where the crossed electrode NW7 is provided on the insulating layer 12.

In the display device DSP according to the fourth embodiment configured as described above, too, the same advantages as those obtained in the first embodiment can be obtained. In the manufacturing process of the first substrate SUB1, a plurality of capacitive electrodes OE arranged in the second direction Y are potentially insulated from each other for a period from the time when the capacitive electrode OE, the connection electrode NW5, and the connection electrode NW6 are formed to the time when the crossed electrode NW7 is formed. Since the crossed electrode NW7 can be formed and the capacitive line CW can be completed in a state in which a plurality of capacitive electrodes OE arranged in the second direction Y are not electrically connected, breakage of the capacitance caused by ESD can hardly occur.

Fifth Embodiment

Figure 19:
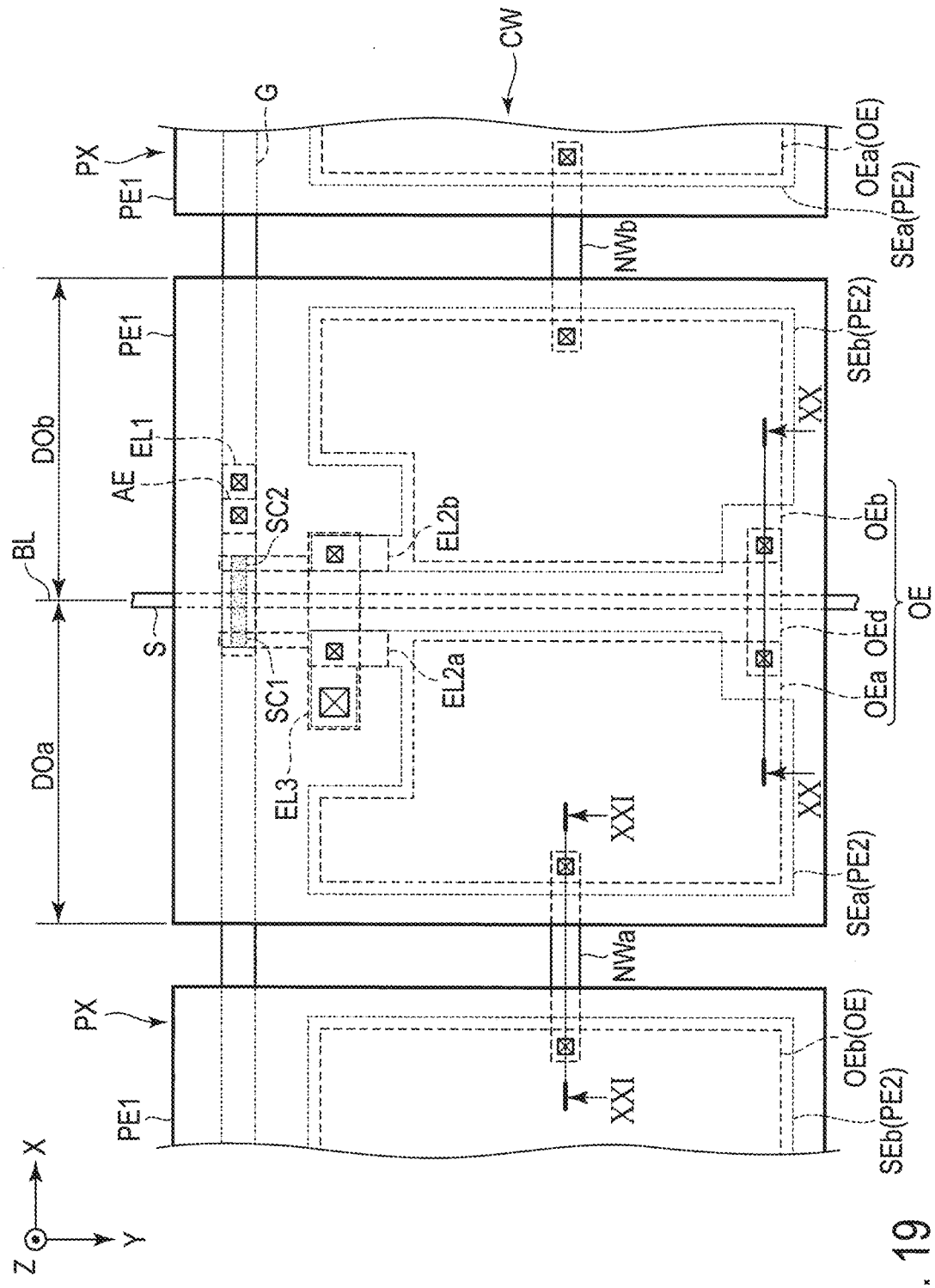
FIG. 19 is an enlarged plan view showing parts of a first substrate of a display device according to a fifth embodiment.

Next, a display device DSP according to a fifth embodiment will be described. FIG. 19 is an enlarged plan view showing parts of a first substrate SUB1 of the display device DSP according to the fifth embodiment.

As shown in FIG. 19, the display device DSP of the fifth embodiment is different from the third embodiment with respect to comprising a crossed electrode OEd instead of the crossed electrode OEc, and a configuration of a connection line NW.

The capacitive electrode OE includes a first capacitive electrode OEa, a second capacitive electrode OEb, and the crossed electrode OEd. The crossed electrode OEd crosses a source line S, and is located to be spaced apart from each of a first segment SEa and a second segment SEb. The crossed electrode OEd overlaps each of the first capacitive electrode OEa and the second capacitive electrode OEb.

In the following descriptions of FIG. 19, a capacitive electrode OE of a central pixel PX, of three pixels PX arranged in the first direction X, is simply referred to as the capacitive electrode OE, the capacitive electrode OE of the pixel PX on the left side is referred to as the other capacitive electrode OE, and the capacitive electrode OE of the pixel PX on the right side is referred to as a third capacitive electrode OE. The other capacitive electrode OE is adjacent to a first capacitive electrode OEa of the capacitive electrode OE. The third capacitive electrode OE is adjacent to a second capacitive electrode OEb of the capacitive electrode OE. The capacitive electrode OE is sandwiched between the third capacitive electrode OE and the other capacitive electrode OE.

Each of a connection line NWa and a connection line NWb extends in the first direction X, and does not cross the gate line G or the source line S. The connection line NWa connects the first capacitive electrode OEa of the capacitive electrode OE to the other capacitive electrode OE. The connection line NWb connects the second capacitive electrode OEb of the capacitive electrode OE to the third capacitive electrode OE. The connection line NWa overlaps each of the second capacitive electrode OEb of the other capacitive electrode OE and the first capacitive electrode OEa. The connection line NWb overlaps each of the first capacitive electrode OEa of the third capacitive electrode OE and the second capacitive electrode OEb.

In the present embodiment, a plurality of connection lines NW and a plurality of capacitive electrodes OE arranged in the first direction X are connected to form a capacitive line CW.

FIG. 20 is a cross-sectional view showing the first substrate SUB1 as viewed along line XX-XX in FIG. 19.

As shown in FIG. 20, the crossed electrode OEd is provided on the insulating layer 13 and is covered with the insulating layer 14. The crossed electrode OEd is in contact with the first capacitive electrode OEa through a contact hole CH8 formed in the insulating layer 13 on one hand, and is in contact with the second capacitive electrode OEb through a contact hole CH9 formed in the insulating layer 13 on the other hand. Based on the above, the crossed electrode OEc electrically connects the first capacitive electrode OEa and the second capacitive electrode OEb.

FIG. 21 is a cross-sectional view showing the first substrate SUB1 as viewed along line XXI-XXI in FIG. 19. As shown in FIG. 21, the connection line NWa (NW) is provided on the insulating layer 13 and is covered with the insulating layer 14. The connection line NWa is in contact with the first capacitive electrode OEa of the capacitive electrode OE through a contact hole CH6 formed in the insulating layer 13 on one hand, and is in contact with the second capacitive electrode OEb of the other capacitive electrode OE through a contact hole CH7 formed in the insulating layer 13 on the other hand. Based on the above, the connection line NWa electrically connects the first capacitive electrode OEa and the second capacitive electrode OEb.

Based on the above, the crossed electrode OEd and the connection line NW are located in a layer different from the layer in which each of the gate line G and the source line S is located. The crossed electrode OEd and the connection line NW are formed of the same material and located in the same layer as an auxiliary gate electrode AE and a third connection electrode EL3.

In the present embodiment, a plurality of connection lines NW, a plurality of first capacitive electrodes OEa, a plurality of second capacitive electrodes OEb, and a plurality of crossed electrodes OEd arranged in the first direction X are connected to form the capacitive line CW.

In the display device DSP according to the fifth embodiment configured as described above, too, the same advantages as those obtained in the third embodiment can be obtained. In the manufacturing process of the first substrate SUB1, a plurality of first capacitive electrodes OEa and a plurality of second capacitive electrodes OEb arranged in the first direction X are potentially insulated from each other for a period from the time when the first capacitive electrodes OEa and the second capacitive electrodes OEb are formed to the time when the crossed electrode OEd and the connection line NW are formed. Since the crossed electrode OEd and the connection line NW can be formed and the capacitive line CW can be completed in a state in which a plurality of first capacitive electrodes OEa and a plurality of second capacitive electrodes OEb arranged in the first direction X are not electrically connected, breakage of the capacitance caused by ESD can hardly occur.

Sixth Embodiment

Figure 22:
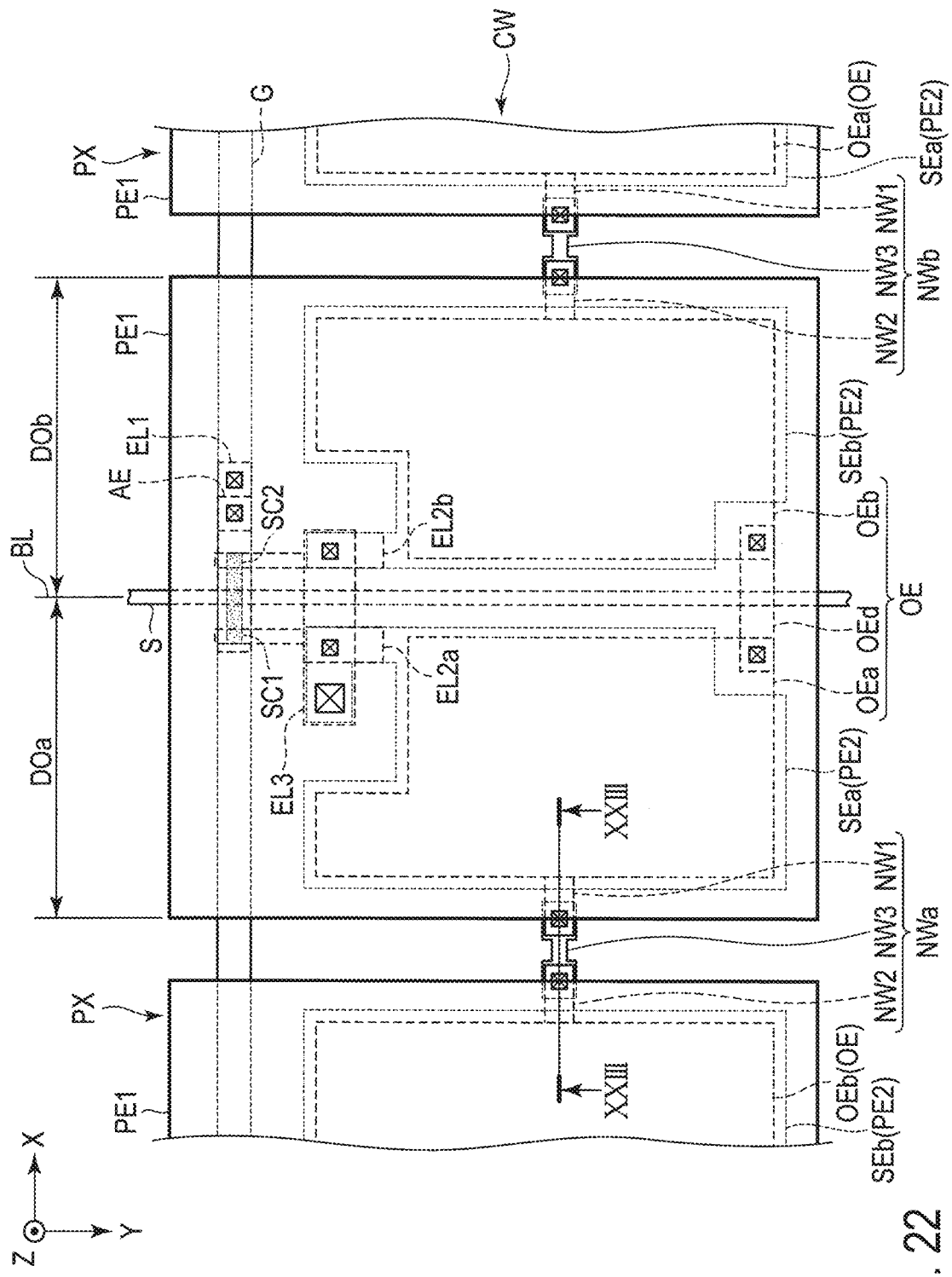
FIG. 22 is an enlarged plan view showing parts of a first substrate of a display device according to a sixth embodiment.

Next, a display device DSP according to a sixth embodiment will be described. FIG. 22 is an enlarged plan view showing parts of a first substrate SUB1 of the display device DSP according to the sixth embodiment.

As shown in FIG. 22, the display device DSP of the sixth embodiment is different from the fifth embodiment with respect to a configuration of a connection line NW.

Each of the connection lines NW is composed of a connection electrode NW1, a connection electrode NW2, and a crossed electrode NW3. The connection electrode NW1 extends in the first direction X, is electrically connected to a first capacitive electrode OEa of a capacitive electrode OE, and extends across an edge of a first segment SEa. The connection electrode NW2 extends in the first direction X, is electrically connected to a second capacitive electrode OEb of the other capacitive electrodes OE, and extends across an edge of a second segment SEb. The connection electrode NW1 and the connection electrode NW2 include portions which do not overlap a second pixel electrode PE2 and are located to be spaced apart from each other. In the present embodiment, the connection electrode NW1 is formed integrally with the first capacitive electrode OEa of the capacitive electrodes OE, and the connection electrode NW2 is formed integrally with the second capacitive electrode OEb of the other capacitive electrode OE.

The crossed electrode NW3 is located to be spaced apart from the second pixel electrode PE2 and is made to overlap each of the connection electrode NW1 and the connection electrode NW2. In the present embodiment, a plurality of connection lines NW and a plurality of capacitive electrodes OE arranged in the first direction X are connected to form a capacitive line CW.

Figure 23:
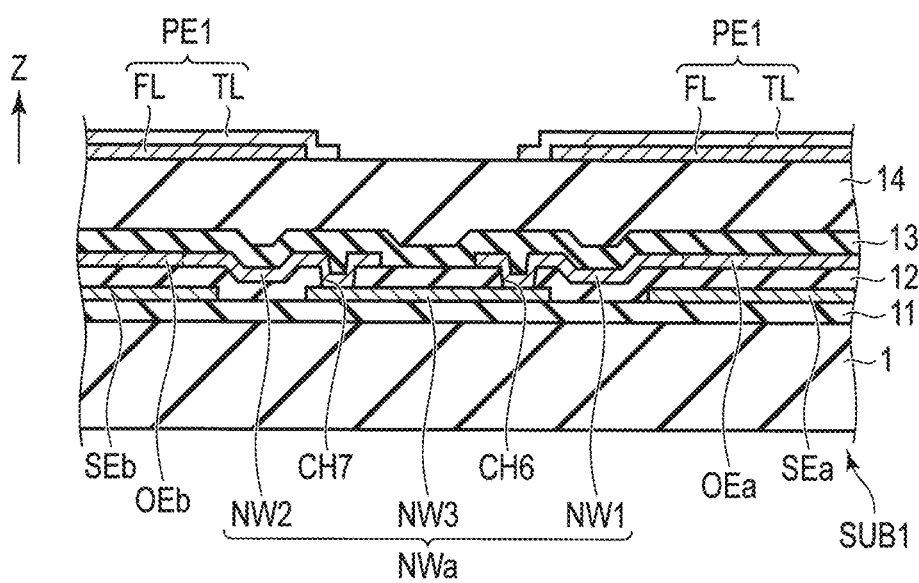
FIG. 23 is a cross-sectional view showing the first substrate viewed along line XXIII-XXIII in FIG. 22.

FIG. 23 is a cross-sectional view showing the first substrate SUB1 as viewed along line XXIII-XXIII in FIG. 22.

As shown in FIG. 23, the crossed electrode NW3 is provided on an insulating layer 11. The crossed electrode NW3 is formed of the same material, in the same layer, as the first segment SEa, the second segment SEb, a gate line G, and the like.

The connection electrode NW1 and the connection electrode NW2 are provided on an insulating layer 12. The connection electrode NW1 and the connection electrode NW2 are formed of the same material, in the same layer, together with the capacitive electrode OE, a source line S, and the like. The connection electrode NW1 is in contact with the crossed electrode NW3 through a contact hole CH6 formed in the insulating layer 12. The connection electrode NW2 is in contact with the crossed electrode NW3 through a contact hole CH7 formed in the insulating layer 12.

In the display device DSP according to the sixth embodiment configured as described above, too, the same advantages as those obtained in the fifth embodiment can be obtained.

Seventh Embodiment

Next, a display device DSP according to a seventh embodiment will be described. FIG. 24 is an enlarged plan view showing parts of a first substrate SUB1 of the display device DSP according to the seventh embodiment.

As shown in FIG. 24, the display device DSP of the seventh embodiment is different from the third embodiment with respect to comprising a crossed electrode OEd instead of a crossed electrode OEc.

The capacitive electrode OE includes a first capacitive electrode OEa, a second capacitive electrode OEb, and the crossed electrode OEd. The crossed electrode OEd crosses a source line S, and is located to be spaced apart from each of a first segment SEa and a second segment SEb. The crossed electrode OEd overlaps each of the first capacitive electrode OEa and the second capacitive electrode OEb. The configuration of the capacitive electrode OE is the same as the configuration (FIG. 20) of the capacitive electrode OE of the fifth embodiment. For example, the crossed electrode OEd is provided on an insulating layer 13 and is covered with an insulating layer 14. The crossed electrode OEd is formed of the same material, in the same layer, as an auxiliary gate electrode AE and a third connection electrode EL3.

In the display device DSP according to the seventh embodiment configured as described above, too, the same advantages as those obtained in the fifth embodiment can be obtained.

Eighth Embodiment

Figure 25:
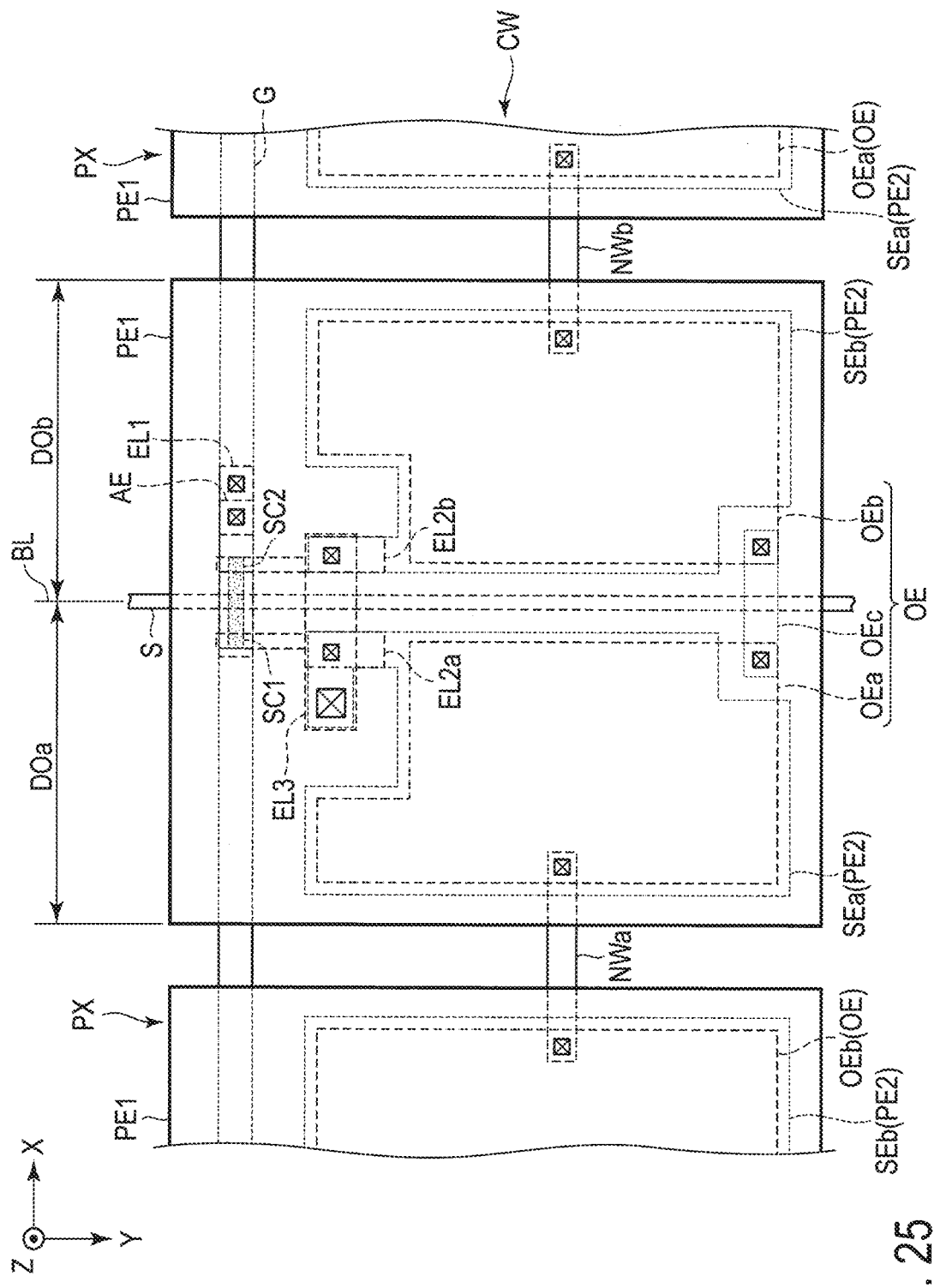
FIG. 25 is an enlarged plan view showing parts of a first substrate of a display device according to an eighth embodiment.

Next, a display device DSP according to an eighth embodiment will be described. FIG. 25 is an enlarged plan view showing parts of a first substrate SUB1 of the display device DSP according to the eighth embodiment.

As shown in FIG. 25, the display device DSP of the eighth embodiment is different from the third embodiment with respect to a configuration of a connection line NW.

In the following descriptions of FIG. 25, a capacitive electrode OE of a central pixel PX, of three pixels PX arranged in the first direction X, is referred to as the capacitive electrode OE, a capacitive electrode OE of a pixel PX on the left side is referred to as the other capacitive electrode OE, and a capacitive electrode OE of a pixel PX on the right side is referred to as a third capacitive electrode OE. The other capacitive electrode OE is adjacent to a first capacitive electrode OEa of the capacitive electrode OE. The third capacitive electrode OE is adjacent to a second capacitive electrode OEb of the capacitive electrode OE. The capacitive electrode OE is sandwiched between the third capacitive electrode OE and the other capacitive electrode OE.

Each of a connection line NWa and a connection line NWb extends in the first direction X, and does not cross the gate line G or the source line S. The connection line NWa connects the first capacitive electrode OEa of the capacitive electrode OE to the other capacitive electrode OE. The connection line NWb connects the second capacitive electrode OEb of the capacitive electrode OE to the third capacitive electrode OE. The connection line NWa overlaps each of the second capacitive electrode OEb of the other capacitive electrode OE and the first capacitive electrode OEa. The connection line NWb overlaps each of the first capacitive electrode OEa of the third capacitive electrode OE and the second capacitive electrode OEb.

In the present embodiment, a plurality of connection lines NW and a plurality of capacitive electrodes OE arranged in the first direction X are connected to form a capacitive line CW. The configuration of the connection line NW, and connection between the connection line NW and the capacitive electrode OE is the same as those of the fifth embodiment (FIG. 21). For example, the connection line NW is provided on the insulating layer 13 and is covered with the insulating layer 14. The connection line NW is formed of the same material, in the same layer, as an auxiliary gate electrode AE and a third connection electrode EL3.

In the display device DSP according to the eighth embodiment configured as described above, too, the same advantages as those obtained in the fifth embodiment can be obtained.

Ninth Embodiment

Next, a display device DSP according to a ninth embodiment will be described. FIG. 26 is an enlarged plan view showing parts of a first substrate SUB1 of the display device DSP according to the ninth embodiment.

As shown in FIG. 26, the display device DSP of the ninth embodiment is different from the third embodiment with respect to a configuration of a connection line NW.

Each of the connection lines NW is composed of a connection electrode NW1, a connection electrode NW2, and a crossed electrode NW3. The connection electrode NW1 extends in the first direction X, is electrically connected to a first capacitive electrode OEa of a capacitive electrode OE, and extends across an edge of a first segment SEa. The connection electrode NW2 extends in the first direction X, is electrically connected to a second capacitive electrode OEb of the other capacitive electrodes OE, and extends across an edge of a second segment SEb. The connection electrode NW1 and the connection electrode NW2 include portions which do not overlap a second pixel electrode PE2 and are located to be spaced apart from each other. In the present embodiment, the connection electrode NW1 is formed integrally with the first capacitive electrode OEa of the capacitive electrodes OE, and the connection electrode NW2 is formed integrally with the second capacitive electrode OEb of the other capacitive electrode OE.

The crossed electrode NW3 is located to be spaced apart from the second pixel electrode PE2 and is made to overlap each of the connection electrode NW1 and the connection electrode NW2. In the present embodiment, a plurality of connection lines NW and a plurality of capacitive electrodes OE arranged in the first direction X are connected to form a capacitive line CW. The configuration of the connection line NW is the same as that of the sixth embodiment (FIG. 23). For example, the connection line NW is provided on an insulating layer 11 and is formed of the same material, in the same layer, as the first segment SEa, the second segment SEb, a gate line G, and the like.

In the display device DSP according to the ninth embodiment configured as described above, too, the same advantages as those obtained in the fifth embodiment can be obtained.

Tenth Embodiment

Figure 27:
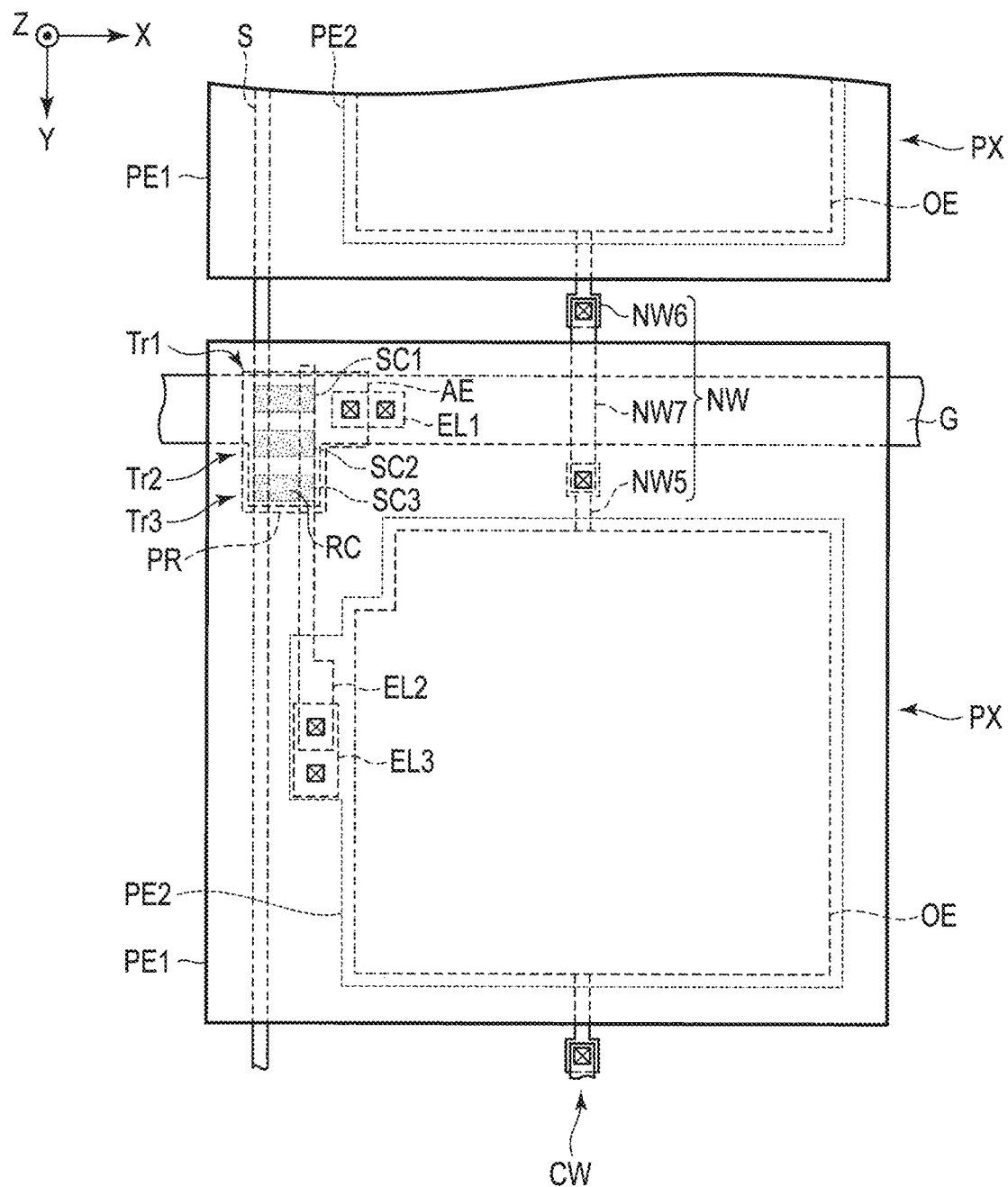
FIG. 27 is an enlarged plan view showing parts of a first substrate of a display device according to a tenth embodiment.

Next, a display device DSP according to a tenth embodiment will be described. FIG. 27 is an enlarged plan view showing parts of a first substrate SUB1 of the display device DSP according to the tenth embodiment. The display device DSP of the tenth embodiment is broadly configured similarly to the display device DSP of the fourth embodiment (FIG. 17). Differences from the configuration of the display device DSP of the fourth embodiment will be described below.

As shown in FIG. 27, in the display device DSP of the tenth embodiment, three transistors Tr are connected parallel between a source line S and a pixel electrode PE.

A pixel PX further includes a third transistor Tr3. A first semiconductor layer SC1, a second semiconductor layer SC2, and a third semiconductor layer SC3 of the third transistor Tr3 extend in the first direction X and are arranged to be spaced apart in the second direction Y. The whole channel regions RC of the respective first semiconductor layer SC1, second semiconductor layer SC2, and third semiconductor layer SC3 are made to overlap the same gate line G. In the tenth embodiment, the whole first semiconductor layer SC1, the whole second semiconductor layer SC2, and the whole third semiconductor layer SC3 are made to overlap the same gate line G.

To make three semiconductor layers SC overlap the same gate line G, the gate line G is formed to be partially wider. In other words, the gate line G includes a protruding portion PR that partially protrudes in the second direction Y so as to be opposed to the second semiconductor layer SC2 and the third semiconductor layer SC3. The protruding portion PR is located to be spaced apart from a second pixel electrode PE2.

In planar view, an auxiliary gate electrode AE may overlap at least the whole channel regions RC of the first semiconductor layer SC1, the second semiconductor layer SC2, and the third semiconductor layer SC3. In the tenth embodiment, the auxiliary gate electrode AE overlaps the whole first semiconductor layer SC1, the whole second semiconductor layer SC2, and the whole third semiconductor layer SC3.

According to the addition of the third semiconductor layer SC3 and the like, a shape of a second pixel electrode PE2, a shape of a second connection electrode EL2, a position of a third connection electrode EL3, and the like are adjusted appropriately.

In the display device DSP according to the tenth embodiment configured as described above, too, the same advantages as those obtained in the fourth embodiment can be obtained. The pixel electrode PE can be driven with a substantially treble current while maintaining an allowable current made to flow to one transistor Tr as compared with a case of connecting one transistor between the source line S and the first pixel electrode PE1.

Eleventh Embodiment

Next, a display device DSP according to an eleventh embodiment will be described. FIG. 28 is an enlarged plan view showing parts of a first substrate SUB1 of the display device DSP according to the eleventh embodiment. The display device DSP of the eleventh embodiment is broadly configured similarly to the display device DSP of the first embodiment (FIG. 5). Differences from the configuration of the display device DSP of the first embodiment will be described below.

As shown in FIG. 28, in the display device DSP of the eleventh embodiment, four transistors Tr are connected parallel between a source line S and a pixel electrode PE.

A pixel PX further includes a third transistor Tr3 and a fourth transistor Tr4. A first semiconductor layer SC1, a second semiconductor layer SC2, a third semiconductor layer SC3 of the third transistor Tr3, and a fourth semiconductor layer SC4 of the fourth transistor Tr4 extend in the first direction X and are arranged to be spaced apart in the second direction Y. The whole channel regions RC of the respective first semiconductor layer SC1, second semiconductor layer SC2, third semiconductor layer SC3 and fourth semiconductor layer SC4 are made to overlap the same gate line G. In the eleventh embodiment, the whole first semiconductor layer SC1, the whole second semiconductor layer SC2, the whole third semiconductor layer SC3, and the whole fourth semiconductor layer SC4 are made to overlap the same gate line G.

To make four semiconductor layers SC overlap the same gate line G, the gate line G is formed to be partially wider. In other words, the gate line G includes a protruding portion PR that partially protrudes in the second direction Y so as to be opposed to the second semiconductor layer SC2, the third semiconductor layer SC3, and the fourth semiconductor layer SC4. The protruding portion PR is located to be spaced apart from a second pixel electrode PE2.

In planar view, an auxiliary gate electrode AE may overlap at least the whole channel regions RC of the respective first semiconductor layer SC1, second semiconductor layer SC2, third semiconductor layer SC3, and fourth semiconductor layer SC4. In the eleventh embodiment, the auxiliary gate electrode AE overlaps the whole first semiconductor layer SC1, the whole second semiconductor layer SC2, the whole third semiconductor layer SC3, and the whole fourth semiconductor layer SC4.

According to the addition of the third semiconductor layer SC3 and the fourth semiconductor layer SC4 and the like, a shape of the second pixel electrode PE2, a shape of a second connection electrode EL2, a position of a third connection electrode EL3, and the like are adjusted appropriately.

In the display device DSP according to the eleventh embodiment configured as described above, too, the same advantages as those obtained in the first embodiment can be obtained. The pixel electrode PE can be driven with a substantially quadruple current while maintaining an allowable current made to flow to one transistor Tr as compared with a case of connecting one transistor between the source line S and the first pixel electrode PE1.

Twelfth Embodiment

Figure 29:
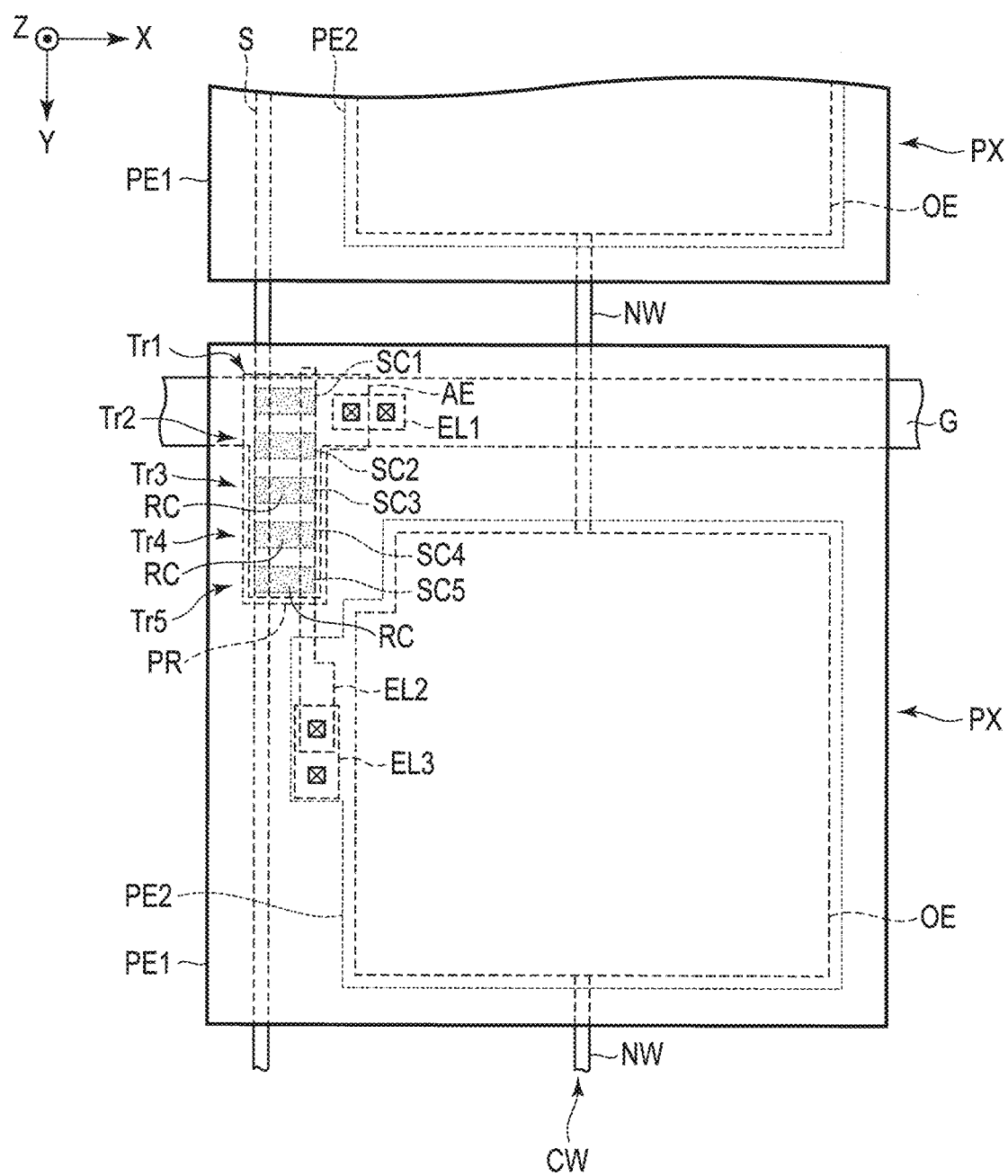
FIG. 29 is an enlarged plan view showing parts of a first substrate of a display device according to a twelfth embodiment.

Next, a display device DSP according to a twelfth embodiment will be described. FIG. 29 is an enlarged plan view showing parts of a first substrate SUB1 of the display device DSP according to the twelfth embodiment. The display device DSP of the twelfth embodiment is broadly configured similarly to the display device DSP of the eleventh embodiment (FIG. 28). Differences from the configuration of the display device DSP of the eleventh embodiment will be described below.

As shown in FIG. 29, in the display device DSP of the twelfth embodiment, five transistors Tr are connected parallel between a source line S and a pixel electrode PE.

A pixel PX further includes a fifth transistor Tr5. A first semiconductor layer SC1, a second semiconductor layer SC2, a third semiconductor layer SC3, a fourth semiconductor layer SC4, and a fifth semiconductor layer SC5 of the fifth transistor Tr5 extend in the first direction X and are arranged to be spaced apart in the second direction Y. The whole channel regions RC of the respective semiconductor layers SC such as the whole channel region RC of the fifth semiconductor layer SC5 are made to overlap the same gate line G. In the twelfth embodiment, the whole first semiconductor layer SC1, the whole second semiconductor layer SC2, the whole third semiconductor layer SC3, the whole fourth semiconductor layer SC4, and the whole fifth semiconductor layer SC5 are made to overlap the same gate line G.

The protruding portion PR is further opposed to the fifth semiconductor layer SC5.

In planar view, the auxiliary gate electrode AE further overlaps at least the whole channel region RC of the fifth semiconductor layer SC5. In the twelfth embodiment, the auxiliary gate electrode AE overlaps the whole first semiconductor layer SC1, the whole second semiconductor layer SC2, the whole third semiconductor layer SC3, the whole fourth semiconductor layer SC4, and the whole fifth semiconductor layer SC5.

According to the addition of the fifth semiconductor layer SC5 and the like, a shape of the protruding portion PR and the like are adjusted appropriately.

In the display device DSP according to the twelfth embodiment configured as described above, too, the same advantages as those obtained in the eleventh embodiment can be obtained. The pixel electrode PE can be driven with a substantially quintuple current while maintaining an allowable current made to flow to one transistor Tr as compared with a case of connecting one transistor between the source line S and the first pixel electrode PE1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. It is possible to combine two or more of the embodiments and the modifications with each other if needed.

For example, in the above-described embodiments, two, three, four or five transistors Tr are connected parallel at positions between the source line S and the pixel electrode PE. However, two or more transistors Tr may be connected parallel at the positions between the source line S and the pixel electrode PE. For this reason, six or more transistors Tr may be connected parallel at the positions between the source line S and the pixel electrode PE.

The transistors Tr may be formed without the auxiliary gate electrode AE.

The semiconductor layers SC may be located between the first basement 1 and the gate line G. When a conductive light-shielding layer is provided between the first basement 1 and the semiconductor layer SC, the light-shielding layer may be electrically connected to the gate line G to function as an auxiliary gate electrode.

The semiconductor substrates of the above-described embodiments cannot be applied only to the first substrate SUB1, but also various types of semiconductor substrates.

In addition, the display devices DSP of the above-described embodiments cannot be applied only to the electrophoretic display device, but also various types of display devices. In the example illustrated, the display device DSP may be a liquid crystal display device. In this case, the display function layer DL is a liquid crystal layer. The liquid crystal layer may employ, for example, polymer dispersed liquid crystal (PDLC).

What is claimed is:

1. A semiconductor substrate comprising:
a gate line extending in a first direction;
a source line extending in a second direction intersecting the first direction;
a pixel electrode;
a first semiconductor layer connected to the source line and the pixel electrode; and
a second semiconductor layer connected to the source line and the pixel electrode,
wherein
the first semiconductor layer and the second semiconductor layer wholly overlap the gate line, and
the first semiconductor layer and the second semiconductor layer extend in the first direction and are arranged to be spaced apart in the second direction.

2. The semiconductor substrate of claim 1, further comprising:
a third semiconductor layer connected to the source line and the pixel electrode,
wherein
the third semiconductor layer is located above the gate line,
the third semiconductor layer extends in the first direction and is arranged to be spaced apart from the second semiconductor layer in the second direction, and
the second semiconductor layer is located between the first semiconductor layer and the third semiconductor layer in the second direction.

3. The semiconductor substrate of claim 2, further comprising:
a connection electrode,
wherein
the pixel electrode is connected to each of the first to third semiconductor layers by the connection electrode.

4. The semiconductor substrate of claim 3, wherein
the gate line includes a protruding portion that partially protrudes in the second direction so as to be opposed to the second semiconductor layer and the third semiconductor layer.

5. The semiconductor substrate of claim 4, wherein
the protruding portion overlaps the source line.

6. The semiconductor substrate of claim 4, wherein
the protruding portion overlaps the connection electrode.

7. The semiconductor substrate of claim 4, wherein
the protruding portion overlaps the source line and the connection electrode.

8. A display device comprising:
a semiconductor substrate, including
a gate line extending in a first direction,
a source line extending in a second direction intersecting the first direction,
a pixel electrode,
a first semiconductor layer connected to the source line and the pixel electrode, and
a second semiconductor layer connected to the source line and the pixel electrode;
a counter substrate including a counter electrode opposed to the first pixel electrode; and
a display function layer located between the semiconductor substrate and the counter substrate,
wherein
the first semiconductor layer and the second semiconductor layer wholly overlap the gate line, and
the first semiconductor layer and the second semiconductor layer extend in the first direction and are arranged to be spaced apart in the second direction.

9. The display device of claim 8, wherein
the display function layer is a liquid crystal layer.

10. The display device of claim 9, wherein
the semiconductor substrate further comprising a third semiconductor layer connected to the source line and the pixel electrode,
the third semiconductor layer is located above the gate line,
the third semiconductor layer extends in the first direction and is arranged to be spaced apart from the second semiconductor layer in the second direction, and
the second semiconductor layer is located between the first semiconductor layer and the third semiconductor layer in the second direction.

11. The display device of claim 10, wherein
the semiconductor substrate further comprising a connection electrode, and
the pixel electrode is connected to each of the first to third semiconductor layers by the connection electrode.

12. The display device of claim 11, wherein
the gate line includes a protruding portion that partially protrudes in the second direction so as to be opposed to the second semiconductor layer and the third semiconductor layer.

13. The display device of claim 12, wherein
the protruding portion overlaps the source line.

14. The display device of claim 12, wherein
the protruding portion overlaps the connection electrode.

15. The display device of claim 12, wherein
the protruding portion overlaps the source line and the connection electrode.

* * * * *